US008861456B2

(12) United States Patent
Huang et al.

(10) Patent No.: US 8,861,456 B2
(45) Date of Patent: Oct. 14, 2014

(54) RADIO COMMUNICATION DEVICE AND METHOD FOR PERFORMING A MULTICARRIER OPERATION USING A PLURALITY OF CARRIERS

(75) Inventors: Lei Huang, Singapore (SG); Isamu Yoshii, Kanagawa (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 510 days.

(21) Appl. No.: 13/266,563

(22) PCT Filed: May 7, 2010

(86) PCT No.: PCT/JP2010/003145
§ 371 (c)(1),
(2), (4) Date: Oct. 27, 2011

(87) PCT Pub. No.: WO2010/131446
PCT Pub. Date: Nov. 18, 2010

(65) Prior Publication Data
US 2012/0051307 A1    Mar. 1, 2012

(30) Foreign Application Priority Data

May 13, 2009 (JP) ................................. 2009-116622

(51) Int. Cl.
*H04W 4/00* (2009.01)
*H04L 5/00* (2006.01)

(52) U.S. Cl.
CPC ............ *H04L 5/0007* (2013.01); *H04L 5/0037* (2013.01)
USPC ........................................................ 370/329

(58) Field of Classification Search
CPC ..... H04W 84/18; H04W 84/12; H04W 88/08; H04W 80/04; H04W 88/06; H04W 72/04; H04W 76/00; H04L 2012/5608

USPC .............. 370/310, 310.2, 313, 315, 328, 329, 370/335, 338, 341, 389, 471
See application file for complete search history.

(56) References Cited

U.S. PATENT DOCUMENTS 7,523,382 B2    4/2009    Kim et al.
7,646,800 B2 *  1/2010    Kim et al. ..................... 375/135
(Continued)

FOREIGN PATENT DOCUMENTS

JP    2007-519361 A    7/2007
JP    2008-507935 A    3/2008
(Continued)

OTHER PUBLICATIONS

IEEE 802.16m System Description Document, IEEE 802.16m-08/003r7, Feb. 2009.
International Search Report for PCT/JP2010/003145 dated Jul. 27, 2010.

*Primary Examiner* — Anh Ngoc Nguyen
(74) *Attorney, Agent, or Firm* — Pearne & Gordon LLP

(57) ABSTRACT

To improve the frequency diversity effect by preventing the related bits in the encoded data from being biased to the specified carrier in the case of performing the multicarrier operation. A modulated symbol sequence is segmented in a data segmentation section (116), and the segmented modulated symbol blocks are mapped on a plurality of carriers in a segment mapping section (120). The data segmentation section (116) groups each of K parts in the modulated symbol sequence into the same number of N groups, cyclically shifts the N groups for the respective parts of any (K−1) parts with shift amounts which differ among the parts, and substitutes the cyclically-shifted groups of the plurality of parts in the modulated symbol sequence with one another among the parts to segment the groups into a plurality of blocks.

12 Claims, 17 Drawing Sheets

(56) References Cited

U.S. PATENT DOCUMENTS

| | | | |
|---|---|---|---|
| 8,699,426 B2 * | 4/2014 | Gaal et al. | 370/329 |
| 2007/0082696 A1 | 4/2007 | Wang | |
| 2007/0296616 A1 | 12/2007 | Lim et al. | |
| 2008/0187005 A1 | 8/2008 | Chauviere et al. | |
| 2009/0141681 A1 * | 6/2009 | Hwang et al. | 370/329 |

FOREIGN PATENT DOCUMENTS

| | | |
|---|---|---|
| JP | 2008-228279 A | 9/2008 |
| WO | 2008/039952 A1 | 4/2008 |

* cited by examiner

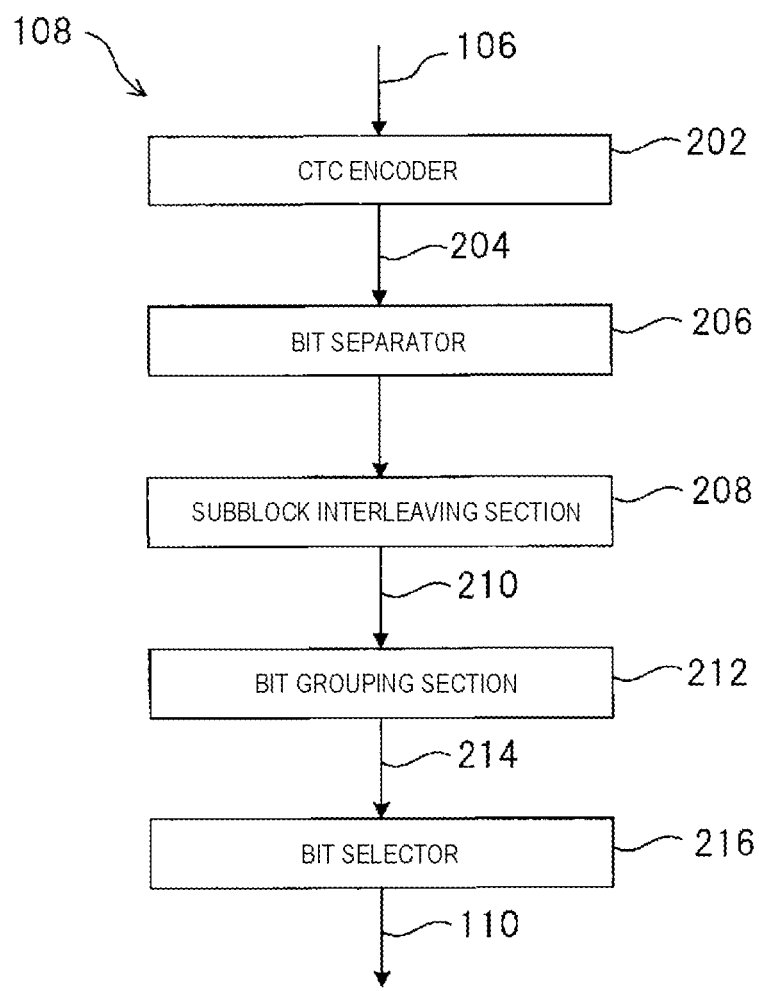
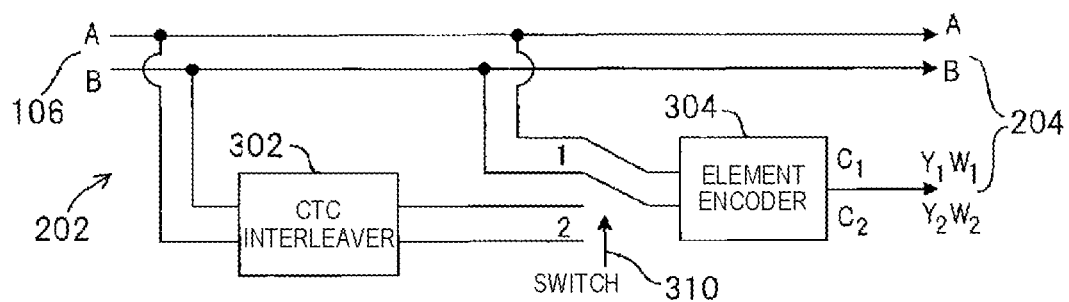

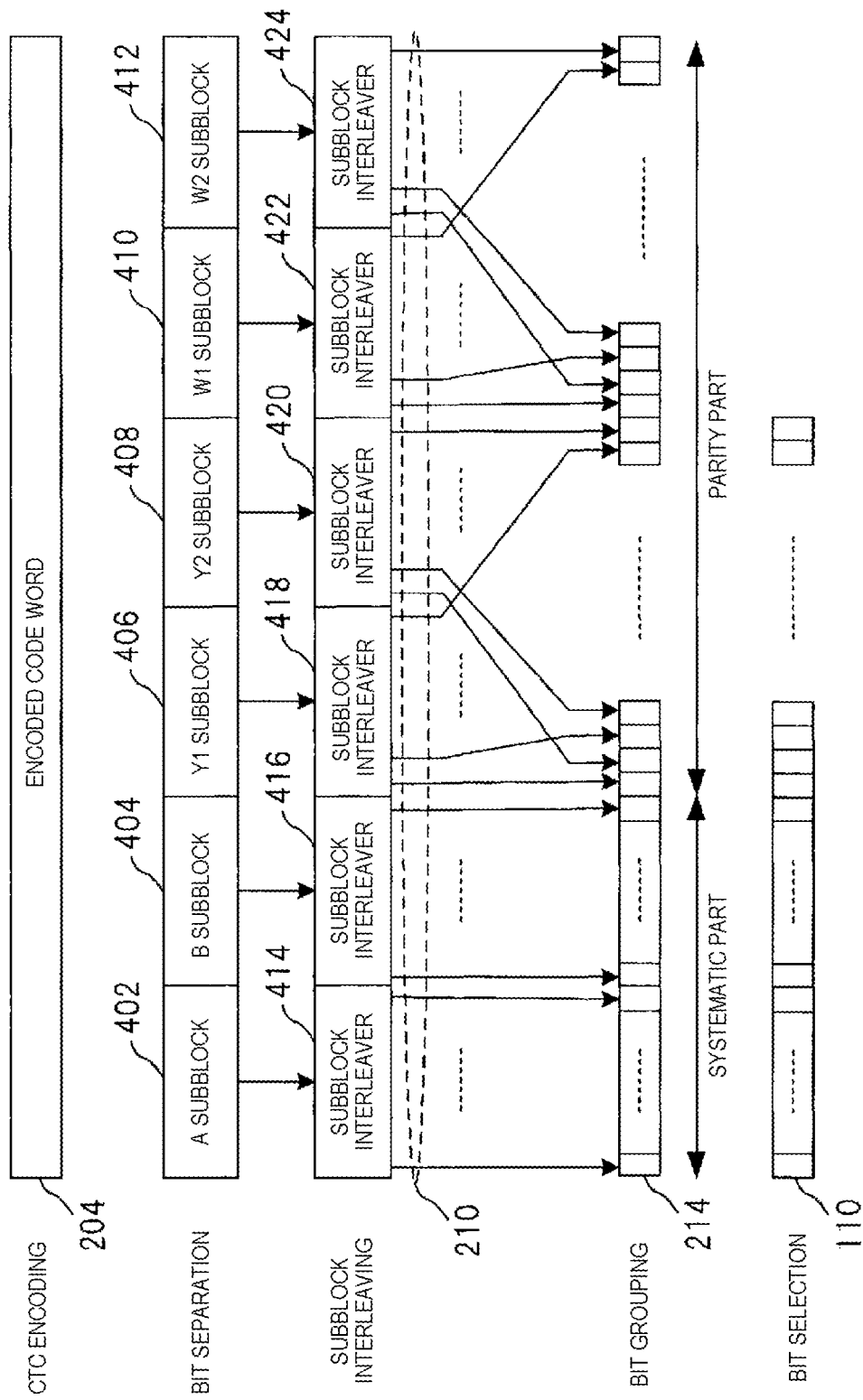

| BLOCK 1 | BLOCK 2 | BLOCK 3 | BLOCK 4 | BLOCK 5 | BLOCK 6 |
|---|---|---|---|---|---|
| A(1)A(2)A(3)A(4) | A(9)A(10)A(11)A(12) | A(17)A(18)A(19)A(20) | A(25)A(26)A(27)A(28) | A(33)A(34)A(35)A(36) | A(41)A(42)A(43)A(44) |
| A(5)A(6)A(7)A(8) | A(13)A(14)A(15)A(16) | A(21)A(22)A(23)A(24) | A(29)A(30)A(31)A(32) | A(37)A(38)A(39)A(40) | A(45)A(46)A(47)A(48) |
| B(17)B(18)B(19)B(20) | B(25)B(26)B(27)B(28) | B(33)B(34)B(35)B(36) | B(41)B(42)B(43)B(44) | B(1)B(2)B(3)B(4) | B(9)B(10)B(11)B(12) |
| B(21)B(22)B(23)B(24) | B(29)B(30)B(31)B(32) | B(37)B(38)B(39)B(40) | B(45)B(46)B(47)B(48) | B(5)B(6)B(7)B(8) | B(13)B(14)B(15)B(16) |
| $Y_1(33)Y_2(33)Y_1(34)Y_2(34)$ | $Y_1(41)Y_2(41)Y_1(42)Y_2(42)$ | $Y_1(1)Y_2(1)Y_1(2)Y_2(2)$ | $Y_1(9)Y_2(9)Y_1(10)Y_2(10)$ | $Y_1(17)Y_2(17)Y_1(18)Y_2(18)$ | $Y_1(25)Y_2(25)Y_1(26)Y_2(26)$ |
| $Y_1(35)Y_2(35)Y_1(36)Y_2(36)$ | $Y_1(43)Y_2(43)Y_1(44)Y_2(44)$ | $Y_1(3)Y_2(3)Y_1(4)Y_2(4)$ | $Y_1(11)Y_2(11)Y_1(12)Y_2(12)$ | $Y_1(19)Y_2(19)Y_1(20)Y_2(20)$ | $Y_1(27)Y_2(27)Y_1(28)Y_2(28)$ |
| $Y_1(37)Y_2(37)Y_1(38)Y_2(38)$ | $Y_1(45)Y_2(45)Y_1(46)Y_2(46)$ | $Y_1(5)Y_2(5)Y_1(6)Y_2(6)$ | $Y_1(13)Y_2(13)Y_1(14)Y_2(14)$ | $Y_1(21)Y_2(21)Y_1(22)Y_2(22)$ | $Y_1(29)Y_2(29)Y_1(30)Y_2(30)$ |
| $Y_1(39)Y_2(39)Y_1(40)Y_2(40)$ | $Y_1(47)Y_2(47)Y_1(48)Y_2(48)$ | $Y_1(7)Y_2(7)Y_1(8)Y_2(8)$ | $Y_1(15)Y_2(15)Y_1(16)Y_2(16)$ | $Y_1(23)Y_2(23)Y_1(24)Y_2(24)$ | $Y_1(31)Y_2(31)Y_1(32)Y_2(32)$ |

↓ WRITE
→ READ

RADIO COMMUNICATION DEVICE AND METHOD FOR PERFORMING A MULTICARRIER OPERATION USING A PLURALITY OF CARRIERS

TECHNICAL FIELD

The present invention relates to a radio communication device and a radio communication method for performing a multicarrier operation using a plurality of carriers.

BACKGROUND ART

Currently, radio mobile communication systems are evolving toward their fourth generation (that is, 4G network). The evolution to 4G, for example, promises a considerable increase in system requirements which is a so-called mobility increase in addition to increase of the number of users and a user bandwidth. Several new technologies are expected to be used to satisfy the increase in the system requirements. Two of these technologies are OFDMA (Orthogonal Frequency Division Multiple Access) and multicarrier transmission, and both are proposed in WiMAX 2.0 (IEEE 802.16m) and 3GPP (3rd Generation Partnership Project) LTE-Advanced (Long Term Evolution Advanced).

OFDM (Orthogonal Frequency Division Multiplexing) is a multiplexing technique that subdivides a bandwidth into a plurality of frequency subcarriers. In the OFDM system, an input data stream is divided into several parallel substreams with a lower data rate (accordingly, increased symbol duration), and the respective substreams are modulated with separate orthogonal subcarriers to be transmitted. The increased symbol duration improves the robustness of the OFDM with respect to the channel delay spread. Further, introduction of a cyclic prefix (CP) is able to completely remove intersymbol interference so far as the CP duration is longer than the channel delay spread. Further, the OFDM modulation may be realized by an efficient inverse fast Fourier transform (IFFT) that makes a plurality of subcarriers usable with little complexity. In the OFDM system, resources are usable in a time domain by OFDM symbols, and in a frequency domain by subcarriers. The OFDMA is a multiple access scheme that performs multiple operations of data streams from the plurality of users to the time and frequency resources.

The multicarrier transmission uses two or more radio frequency carriers (RF carriers) to exchange data between a base station (BS) and a plurality of mobile stations (MS). According to IEEE 802.16m system description document (SDD), the respective mobile stations are controlled by RF carriers that are called primary carriers [see IEEE 802.16m SDD, IEEE 802.16m-08/003r7, February, 2009 (Non-Patent Literature 1), p. 144]. Additional RF carriers may be defined and used in order to improve the user experience and the quality of service (QoS). Further, the additional RF carriers may be configured and optimized for a specific service. These additional RF carriers are called secondary carriers.

In a multicarrier operation, in the same manner as the single carrier operation, a single MAC (Media Access Control) PDU (Protocol Data Unit) or a connection MAC PDU is received through a PHY (Physical Layer) SAP (Service Access Point), and thereafter, FEC (Forward Error Correction) blocks that are called PHY PDU are formed. The PHY generates a single modulation symbol sequence that is considered as a single hybrid ARQ (HARQ: Hybrid Automatic Repeat Request) packet by executing channel encoding, modulation, and MIMO (Multiple Input Multiple Output) encoding for the PHY PDU. According to IEEE 802.16m SDD (see Non-Patent Literature 1, p. 143), in the OFDMA multicarrier operation, the modulation symbol sequence of the PHY PDU may be transmitted in two styles as below.

1. The modulation symbol sequence is transmitted with any one of the plurality of RF carriers (primary or secondary carriers). Here, different PHY PDUs that are transmitted with the same or different RF carriers may have different MCS (Modulation and Coding Schemes) and MIMO schemes.

2. In using the same MCS and MIMO schemes, by data-segmenting and mapping on different RF carriers, the modulation symbol sequence is transmitted in DRUs (Distributed Resource Units) that are carried over several RF carriers.

In this description, as a method of transmitting a modulation symbol sequence of the PHY PDU in the OFDMA multicarrier operation, a case of using the second method is presupposed.

According to IEEE 802.16m SDD (see Non-Patent Literature 1, p. 72), the DRU is a kind of LRU (Logical Resource Unit) that includes a group of subcarriers that spread across the entire bandwidth of a single RF carrier. The LRU is a basic logical unit for allocating resources, the LRU is a subcarrier of $18 \times N_{sym}$, and here, $N_{sym}$ is the number of OFDMA symbols per subframe. The LRU includes pilots, and thus the effective number of subcarriers in the LRU depends on the number of allocated pilots. FIG. 17 is a diagram exemplifying an LRU 1500 in the OFDMA multicarrier operation. In FIG. 17, the number of OFDMA symbols is $N_{sym}=6$. Accordingly, LRU 1500 corresponds to 18×6 subcarriers. The LRU 1500 includes a signal pilot stream that includes 6 pilot subcarriers 52, 54, 56, 58, 60, and 62. Accordingly, the effective number of subcarriers in the LRU 1500 is 102.

FIG. 18 is a block diagram illustrating the configuration example of a transmitter compatible with the multicarrier operation. The transmitter 1600 includes a channel encoder 1608, a modulator 1612, a data segmentation section 1616, a segment mapping section 1620, and a set 1624 of k subcarrier mapping/IFFT sections, and outputs a set 1626 of k RF carriers. The value of the number k of RF carriers is predetermined. Here, a specific subcarrier mapping/IFFT section is provided to correspond to a specific RF carrier. For example, the first subcarrier mapping/IFFT section 1-1624a corresponds to the RF carrier 1-1626a, and the k-th subcarrier mapping/IFFT section k-1624b corresponds to the RF carrier k-1626b.

In the transmitter 1600, the channel encoder 1608 encodes the PHY PDU 1606 entered as input data. The channel encoder 1608 performs encoding by a turbo code through a CTC (Convolutional Turbo Coding) Encoder, and generates systematic bit streams A and B and parity bit streams $Y_1/Y_2$ and $W_1/W_2$. Further, the channel encoder 1608 separates the systematic bit streams and the parity bit streams into respective subblocks A, B, $Y_1$, $Y_2$, $W_1$, and $W_2$, and performs interleaving of the respective subblocks in sections of bits through subblock interleavers. Thereafter, the channel encoder 1608 performs interlacing of the subblocks of the parity bits, which alternately arranges bits in $Y_1$ and $Y_2$, and $W_1$ and $W_2$, and selects and outputs bits according to the coding rate of the transmission data.

Next, the transmitter 1600 generates modulated symbol sequence 1614 by performing modulation of the encoded data 1610 of the output of the channel encoder 1608 using a predetermined modulation technique such as 16 QAM or the like according to the MCS through the modulator 1612. Then, the data segmentation section 1616 performs data segmentation that divides the modulated symbol sequence 1614 into predetermined blocks, and the segment mapping section 1620 performs mapping of the divided segments on data blocks 1618. Accordingly, the respective data blocks 1618 are allocated with RF carrier 1 to RF carrier k. Next, the subcarrier mapping/IFFT sections 1624a to 1624b that correspond to the respective RF carriers generate transmission data of the respective RF carriers of 1-1626a to k-1626b by performing a process of mapping the transmission data onto the subcarriers and an IFFT process. By the above-described operation, the transmission data of the multicarrier is generated and output.

CITATION LIST

Patent Literature

Patent Literature 1: JP-T-2007-519361

Non Patent Literature

Non-Patent Literature 1: IEEE 802.16m System Description Document, IEEE 802.16m-08/003r7, February 2009

SUMMARY OF INVENTION

Technical Problem

In the case of performing a multicarrier operation, a problem may occur in which related bits are biased to a specified carrier with respect to data of respective subblocks of systematic bits A and B and parity bits $Y_1$, $Y_2$, $W_1$, and $W_2$ that are encoded data. In this case, it is possible to disperse the related bits so that the related bits are prevented from being biased by performing segmentation of the modulation symbol sequence as in the configuration example illustrated in FIG. 18 and performing mapping of the respective segments on the RF carriers. However, under certain conditions, such as the FEC block size, the degree of modulation, the effective number of subcarriers in LRU, and the like, only performing of mapping of plural RF carriers simply through segmentation may cause the related systematic bits and parity bits to be biased to the same carrier. In this case, the decoding performance such as error correction capability or the like on the reception side is deteriorated.

Accordingly, an object of the present invention is to provide a radio communication device and a radio communication method capable of improving the frequency diversity effect by preventing related bits in encoded data from being biased to a specified carrier in the case of performing a multicarrier operation.

Solution to Problem

The present invention provides, as a first aspect, a radio communication device for performing a multicarrier operation using a plurality of carriers, the radio communication device including: a modulator that is configured to generate a modulated symbol sequence in accordance with a predetermined modulation scheme from an encoded data sequence to be transmitted; a data segmentation section that is configured to segment the modulated symbol sequence; and a segment mapping section that is configured to map segmented modulated symbol blocks on the plurality of carriers, wherein the data segmentation section includes: a symbol grouping section that is configured to group each part of a plurality of parts in the modulated symbol sequence which can be divided on the basis of subblocks in the encoded data sequence, into a same number of groups; a group cyclic shifter that is configured to cyclically shift a plurality of groups for each part of the plurality of parts with shift amounts which differ among the plurality of parts; and a group substitution and segmentation section which is configured to substitute the cyclically-shifted groups for each part of the plurality of parts in the modulated symbol sequence with one another among the plurality of parts, to segment the groups into a plurality of blocks.

The present invention includes, as a second aspect, the radio communication device, wherein the symbol grouping section is configured to group each part of J×K parts in the modulated symbol sequence into N groups so that the N groups of the same part have almost the same number of modulated symbols, and the group cyclic shifter is configured to cyclically shift the N groups for each part of any (K−1) parts in the modulated symbol sequence, where J indicates a number of FEC (Forward Error Correction) blocks that correspond to the modulated symbol sequence, N indicates a number of LRUs (Logical Resource Units) allocated to the FEC blocks, and K indicates a positive integer which is equal to 3 or 4.

The present invention includes, as a third aspect, the radio communication device, wherein the K parts in the modulated symbol sequence are three parts, where K is equal to 3, and includes a systematic part A, a systematic part B and a parity part that are generated from bit sequences of systematic bits A, systematic bits B and parity bits in the encoded data sequence, respectively.

The present invention includes, as a fourth aspect, the radio communication device, wherein the K parts in the modulated symbol sequence are four parts, where K is equal to 4, and includes a systematic part A, a systematic part B, a parity part Y and a parity part W that are generated from bit sequences of systematic bits A, systematic bits B, parity bits $Y_1$ and $Y_2$, and parity bits $W_1$ and $W_2$ in the encoded data sequence, respectively The present invention includes, as a fifth aspect, the radio communication device, wherein the group cyclic shifter cyclically shifts the groups for each part of any (K−1) parts in the modulated symbol sequence with (K−1) number of different shift amounts in the same direction, respectively The present invention includes, as a sixth aspect, the radio communication device, wherein the (K−1) number of shift amounts are represented by i×⌊N/K⌋ groups for i=1, 2, ..., K−1, where "⌊ ⌋" indicates a floor operator.

The present invention includes, as a seventh aspect, the radio communication device, wherein, when K=3, the group cyclic shifter cyclically shifts the groups for each part of two parts of any (K−1) parts in the modulated symbol sequence with a same shift amount in opposite directions, respectively.

The present invention includes, as an eighth aspect, the radio communication device, wherein the shift amount is represented by ⌊N/K⌋ groups, where "⌊ ⌋" indicates a floor operator.

The present invention provides, as a ninth aspect, a radio communication device for performing a multicarrier operation using a plurality of carriers, the radio communication device including: a segment demapping section that is configured to demap received modulated symbols which have been mapped on the plurality of carriers to restore segmented modulated symbol blocks; a data assembly section that is configured to assemble an original modulated symbol sequence from the segmented modulated symbol blocks; and a demodulator that is configured to demodulate the modulated symbol sequence in accordance with a predetermined modulation scheme and generate an encoded data sequence to be received, wherein the data assembly section includes a function block that is configured to perform an inverse process corresponding to functions of the data segmentation section of the radio communication device as in the first aspect, so as to perform a combining and an inverse substitution of the segmented modulated symbol blocks, a group cyclic shift in reverse direction, an unification of respective grouped parts, and a combining of the modulated symbol sequence.

The present invention provides, as a tenth aspect, a radio communication method in a radio communication device for performing a multicarrier operation using a plurality of carriers, the radio communication method including the steps of; generating a modulated symbol sequence in accordance with a predetermined modulation scheme from an encoded data sequence to be transmitted; segmenting the modulated symbol sequence; and mapping segmented modulated symbol blocks on the plurality of carriers, wherein the step of the segmentation includes the steps of; grouping each part of a plurality of parts in the modulated symbol sequence which can be divided on the basis of subblocks in the encoded data sequence, into a same number of groups; cyclically shifting a plurality of groups for each part of the plurality of parts with shift amounts which differ among the plurality of parts; and substituting the cyclically-shifted groups for each part of the plurality of parts in the modulated symbol sequence among the plurality of parts to segment the groups into a plurality of blocks.

The present invention includes, as an eleventh aspect, the radio communication device, wherein, in the step of grouping, each part of J×K parts in the modulated symbol sequence is grouped into N groups so that the N groups of the same part have almost the same number of modulated symbols, and in the step of cyclically shifting, the N groups for each part of any (K−1) parts in the modulated symbol sequence are cyclically shifted, where J indicates a number of FEC blocks that corresponds to the modulated symbol sequence, N indicates a number of LRUs allocated to the FEC blocks, and K indicates a positive integer which is equal to 3 or 4.

The present invention provides, as a twelfth aspect, a radio communication method in a radio communication device for performing a multicarrier operation using a plurality of carriers, the radio communication method including the steps of; demapping received modulated symbols which have been mapped on the plurality of carriers to restore segmented modulated symbol blocks; assembling an original modulated symbol sequence from the segmented modulated symbol blocks; and demodulating the modulated symbol sequence in accordance with a predetermined modulation scheme to generate an encoded data sequence to be received, wherein the step of assembling the modulated symbol sequence includes a step of performing inverse process corresponding to the step of the segmentation of the radio communication method as in the tenth aspect so as to perform a combining and an inverse substitution of the segmented modulated symbol blocks, a group cyclic shift in reverse direction, an unification of respective grouped parts, and a combining of the modulated symbol sequence.

By the above-described configuration, the related bits in the encoded data are dispersed to different blocks through grouping of the plural parts of the modulation symbol sequence, cyclic shift to the plural groups for the respective parts, substitution of the groups of the modulation symbol sequence of the plural parts cyclically shifted, and segmentation into the multiple blocks, and thus the related bits in the encoded data are prevented from being biased to the specified carrier. By this, it becomes possible to improve the frequency diversity effect.

Advantageous Effects of Invention

According to the present invention, the radio communication device and the radio communication method can be provided, which can improve the frequency diversity effect by preventing the related bits in the encoded data from being biased to the specified carrier in the case of performing the multicarrier operation.

BRIEF DESCRIPTION OF DRAWINGS

FIG. 3 is a block diagram illustrating the configuration example of a channel encoder according to an embodiment of the invention.

FIG. 4 is a diagram illustrating the configuration example of a CTC encoder according to an embodiment of the invention.

FIG. 5 is a diagram illustrating the operational example of a channel encoder according to an embodiment of the invention.

FIG. 8 is a diagram illustrating the arrangement example of segmentation blocks by the data segmentation method illustrated in FIGS. 6 and 7.

FIG. 12 is a diagram illustrating the arrangement example of segmentation blocks by the data segmentation method illustrated in FIGS. 10 and 11.

MODE FOR CARRYING OUT INVENTION

An embodiment of the invention shows an example in which a radio communication device and a radio communication method according to the invention are applied to a radio communication system compatible with IEEE 802.16m. Here, a case is exemplified in which multicarrier communication is performed between a transmission-side radio communication device (transmission device) and a reception-side radio communication device (reception device). Further, it is assumed that as a transmission data modulation method, QPSK, 16 QAM, 64 QAM, and the like, are used.

Figure 1:
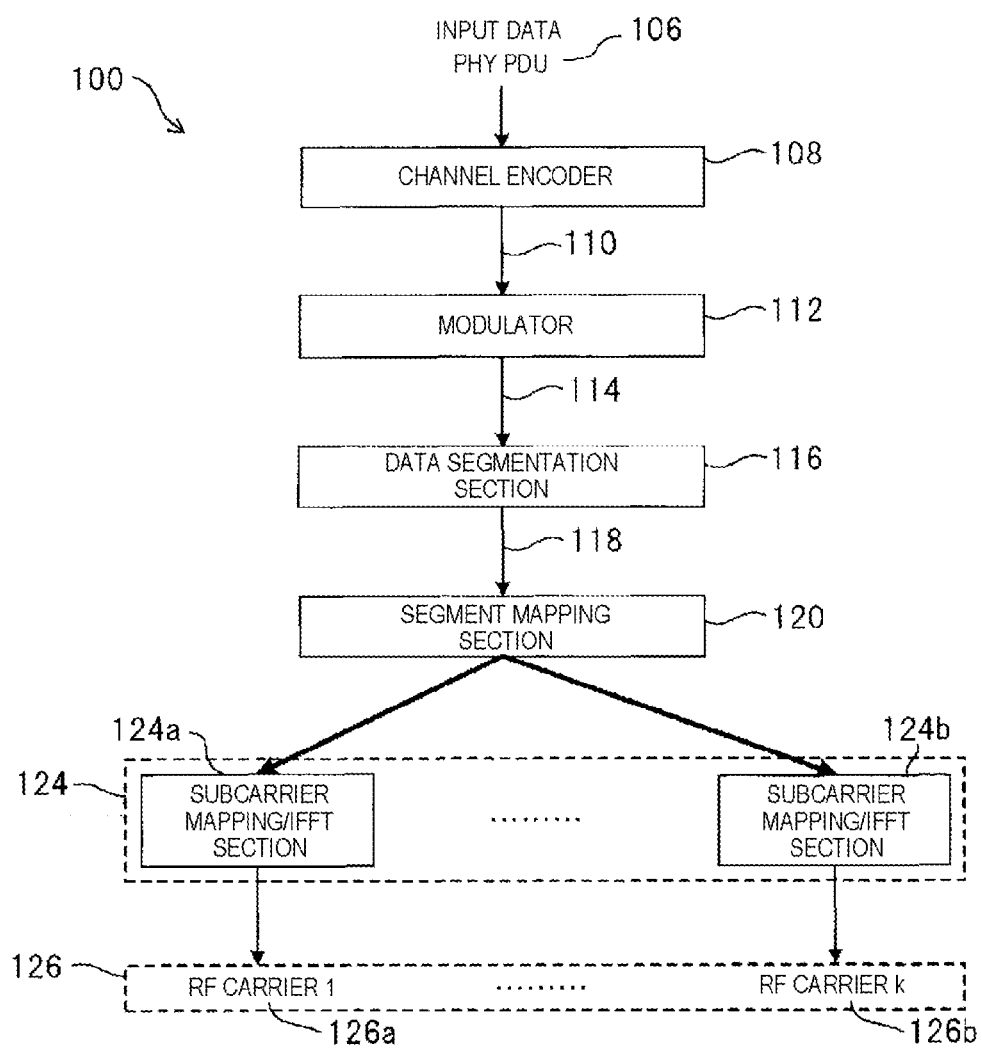
FIG. 1 is a block diagram illustrating the configuration example of a transmitter of a radio communication device according to an embodiment of the invention.

FIG. 1 is a block diagram illustrating the configuration example of a transmitter of a radio communication device according to an embodiment of the invention. FIG. 1 exemplifies the configuration of a transmitter 100 compatible with the multicarrier operation by a set 126 of k RF carriers of RF carrier 1 to RF carrier k. The number k of RF carriers is predetermined. The transmitter 100 includes a channel encoder 108, a modulator 112, a data segmentation section 116, a segment mapping section 120, and a set 124 of k subcarrier mapping/IFFT sections. The transmitter 100 receives a PHY PDU 106 entered as input data to be transmitted, encodes and modulates the input data, and outputs and transmits the set 126 of k RF carriers. Here, a specified subcarrier mapping/IFFT section is provided to correspond to a certain specified RF carrier. For example, the first subcarrier mapping/IFFT section 1-124a corresponds to an RF carrier 1-126a, and the k-th subcarrier mapping/IFFT section k-124b corresponds to an RF carrier k-126b.

Figure 2:
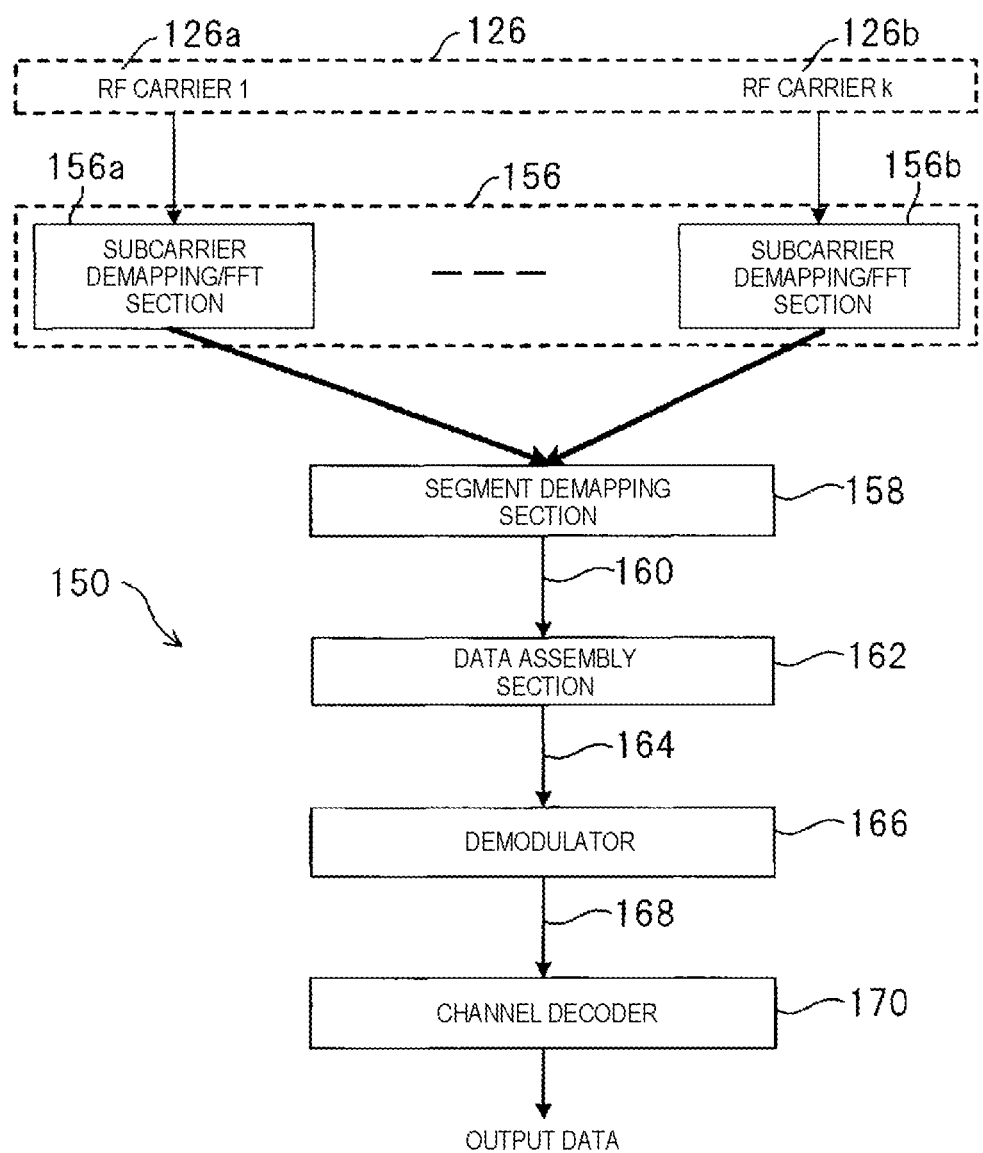
FIG. 2 is a block diagram illustrating the configuration example of a receiver of a radio communication device according to an embodiment of the invention.

FIG. 2 is a block diagram illustrating the configuration example of a receiver of a radio communication device according to an embodiment of the invention. FIG. 2 exemplifies the configuration of a receiver 150 compatible with the multicarrier operation by the set 126 of k RF carriers of RF carrier 1 to RF carrier k. The number k of RF carriers is predetermined. The receiver 150 includes a set 156 of k subcarrier demapping/FFT sections, a segment demapping section 158, a data assembly section 162, a demodulator 166, and a channel decoder 170. The receiver 150 receives the set 126 of k RF carriers, acquires a data sequence to be received by performing demodulation and decoding of the RF carriers set 126, and outputs the acquired data sequence as output data. Here, a specified subcarrier demapping/FFT section is provided to correspond to a certain specified RF carrier. For example, the first subcarrier demapping/FFT section 1-156a corresponds to an RF carrier 1-126a, and the k-th subcarrier demapping/FFT section k-156b corresponds to the RF carrier k-126b.

As illustrated in FIGS. 1 and 2, the set 156 of subcarrier demapping/FFT sections of the receiver 150 executes an inverse operation of the set 124 of subcarrier mapping/IFFT sections of the transmitter 100. The segment demapping section 158 of the receiver 150 executes an inverse operation of the segment mapping section 120 of the transmitter 100. The data assembly section 162 of the receiver 150 executes an inverse operation of the data segmentation section 116 of the transmitter 100. The demodulator 166 of the transmitter 150 executes an inverse operation of the modulator 112 of the transmitter 100. The channel decoder 170 of the receiver 150 executes an inverse operation of the channel encoder 108 of the transmitter 100.

FIG. 3 is a block diagram illustrating the configuration example of the channel encoder 108 illustrated in FIG. 1. As illustrated in FIGS. 1 and 3, the channel encoder 108 receives the PHY PDU 106 as its input in order to generate subpackets 110 of the encoded data. The channel encoder 108 includes a CTC encoder 202, a bit separator 206, a subblock interleaving section 208, a bit grouping section 212, and a bit selector 216.

FIG. 4 is a diagram illustrating the configuration example of the CTC encoder 202 illustrated in FIG. 3. The CTC encoder 202 includes a CTC interleaver 302, an element encoder 304, and a switch 310. As illustrated in FIGS. 3 and 4, the CTC encoder 202 generates an encoded code word 204 by applying CTC encoding to the PHY PDU 106 at a mother code rate of ⅓. Bits of the PHY PDU 106 are alternately supplied to input terminals A and B of the CTC encoder 202 to form systematic bit sequences A and B.

At first, the CTC encoder 202 supplies the systematic bit sequences A and B to the element encoder 304 in the order as they are (switch 310 is in a state of position 1). A first encoding at this time is called $C_1$ encoding. Thereafter, the CTC encoder 202 supplies the interleaved systematic bit sequence A and the interleaved systematic bit sequence B, which pass through the CTC interleaver 302, to the element encoder 304 (switch 310 is in a state of position 2). A second encoding at this time is called $C_2$ encoding. The encoded code word 204 includes the systematic bit sequences A and B, parity bit sequences $Y_1$ and $W_1$ generated by $C_1$ encoding, and parity bit sequences $Y_2$ and $W_2$ generated by $C_2$ encoding. As regards further details of the CTC interleaver 302, the element encoder 304, and $C_1$ and $C_2$ encoding, refer to IEEE 802.16m Amendment Working Document (AWD), IEEE 802.16m-09/001rla, p. 130-132.

FIG. 5 is a diagram illustrating the operational example of the channel encoder 108 illustrated in FIG. 3. As illustrated in FIGS. 3 and 5, the encoded code word 204 that is CTC-encoded by the CTC encoder 202 is supplied to the bit separator 206. The bit separator 206 separates the encoded code word 204 into six subblocks which are indicated by subblock A 402, subblock B 404, subblock $Y_1$ 406, subblock $Y_2$ 408, subblock $W_1$ 410, and subblock $W_2$ 412. More specifically, the bit separator 206 distributes the systematic bit sequence A of the encoded code word 204 to A subblock 402, the systematic bit sequence B to B subblock 404, the parity bit sequence $Y_1$ to $Y_1$ subblock 406, the parity bit sequence $Y_2$ to $Y_2$ subblock 408, the parity bit sequence W1 to W1 subblock 410, and the parity bit sequence $W_2$ to $W_2$ subblock 412, respectively.

Further, as illustrated in FIGS. 3 and 5, the subblock interleaving section 208 includes six subblock interleavers 414, 416, 418, 420, 422, and 424. These subblock interleavers 414 to 424 are used to interleave six subblocks 402, 404, 406, 408, 410, and 412, respectively. The subblock interleaving is executed in a bit unit for each subblock. Here, it is assumed that the six subblock interleavers 414, 416, 418, 420, 422, and 424 have the same interleaving procedure and parameters. As regards further details of the subblock interleaving procedure and parameters, refer to IEEE 802.16m AWD, IEEE 802.16m-09/0010rla, p. 132-134.

Further as illustrated in FIGS. 3 and 5, the subblock bit sequence 210 of the interleaved A, B, $Y_1$, $Y_2$, $W_1$, and $W_2$ subblocks is supplied to the bit grouping section 212. The bit grouping section 212 performs interlacing that alternately arranges the bits at $Y_1$ and $Y_2$, and at $W_1$ and $W_2$ of the $Y_1$, $Y_2$, $W_1$, and $W_2$ subblocks of the parity bit. The output bit sequence 214 of the bit grouping section 212 is composed of the interleaved A and B subblock bit sequences and the subsequent bit-unit multiplexed bit sequences of the interleaved $Y_1$ and $Y_2$ subblocks, and bit-unit multiplexed bit sequences of the interleaved $W_1$ and $W_2$ subblocks. In other words, the subblock bit sequences 210 of the interleaved A, B, $Y_1$, $Y_2$, $W_1$, and $W_2$ subblocks are represented as follows.

$A(1), A(2), \ldots, A(N_{FB}/2)$,
$B(1), B(2), \ldots, B(N_{FB}/2)$,
$Y_1(1), Y_1(2), \ldots, Y_1(N_{FB}/2)$,
$Y_2(1), Y_2(2), \ldots, Y_2(N_{FB}/2)$,
$W_1(1), W_1(2), \ldots, W_1(N_{FB}/2)$,
$W_2(1), W_2(2), \ldots, W_2(N_{FB}/2)$ Here, $N_{FB}$ is an FEC block size.

Accordingly, the output bit sequence 214 of the bit grouping section 212 is represented as follows:

A(1), A(2), ..., A($N_{FB}$/2),
B(1), B(2), ..., B($N_{FB}$/2),
$Y_1$(1), $Y_2$(1), $Y_1$(2), $Y_2$(2), ..., $Y_1$($N_{FB}$/2), $Y_2$($N_{FB}$/2)
$W_1$(1), $W_2$(1), $W_1$(2), $W_2$(2), ..., $W_1$($N_{FB}$/2), $W_2$($N_{FB}$/2)

Here, the parity bits $Y_1$(i) and $W_1$(i) are generated by performing $C_1$ encoding of the systematic bits A(i) and B(i) with respect to i=1, 2, ..., $N_{FB}$/2. i is an index of the bit sequence before the respective subblocks are encoded. In this case, it is assumed that the six subblock interleavers 414, 416, 418, 420, 422, and 424 have the same interleaving procedure and parameters in all. Accordingly, A(i), B(i), Yi(i), and Wi(i) having the same index become always related systematic bits and parity bits.

Further, as illustrated in FIGS. 3 and 5, the bit selector 216 selects a specified successive bit sequence from the output bit sequence 214 of the bit grouping section 212 according to a specified start position and a specified length of the subpacket that is determined by the code rate or the like of the transmission data. Accordingly, the subpacket 110 of the encoded data that is output from the channel encoder 108 is generated by the bit selector 216. Specifically, at an initial transmission of HARQ operation, the subpacket 110 is generated by selecting a successive bit sequence that starts from the initial bit of the systematic bits of the output bit sequence 214 of the bit grouping section 212. Further, the initial subpacket may be used as a code word for burst transmission to which HARQ is not applied.

The length of the subpacket 110 of the output of the channel encoder 108 is determined by the following equation (1).

$$L_b = N \times P \times M \quad (1)$$

Here, N is the specified total number of LRUs allocated to the RF carriers set 126, P is a predetermined effective number of subcarriers per LRU, and M is the degree of modulation. The degree of modulation M is 2 in the case of QPSK, 4 in the case of 16 QAM, and 6 in the case of 64 QAM, respectively.

As illustrated in FIG. 1, the subpacket 110 output from the channel encoder 108 is supplied to the modulator 112. The modulator 112 performs modulation by mapping the input subpacket 110 on the modulated symbol sequence 114 according to a specified modulation method (for example, 16 QAM) and if applicable, a predetermined constellation rearrangement version. According to the equation (1), the length of the modulated symbol sequence 114 is given by the following equation (2).

$$L = N \times P \quad (2)$$

According to the channel encoding process illustrated in FIGS. 3 and 5, since the process is performed for each subblock, neither of the bit interleaving and the symbol interleaving is executed through the systematic bits and the parity bits. Accordingly, the modulated symbol sequence 114 is actually composed of two parts, a systematic part and a parity part. The systematic part is composed of modulated symbols prepared by the systematic bits, and the parity part is composed of modulated symbols prepared by the parity bits.

Further, the data segmentation section 116 illustrated in FIG. 1 generates a plurality of segmented blocks 118 by dividing the modulated symbol sequence 114 into blocks each of which has a size that is suitable for a single LRU. Here, it is exemplified that the data segmentation section 116 performs simple segmentation.

Figure 6:
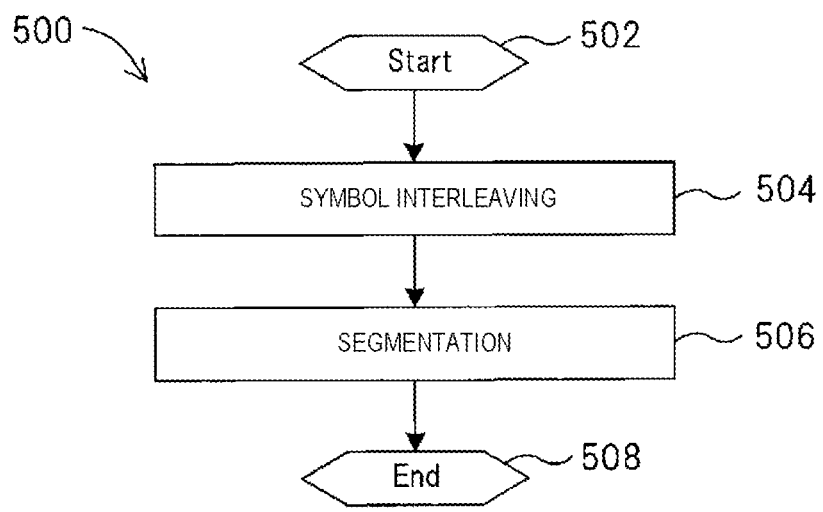
FIG. 6 is a flowchart illustrating a data segmentation method in the case of applying simple segmentation.

FIG. 6 is a flowchart illustrating a data segmentation method 500 in the case of applying simple segmentation. This data segmentation method 500 starts from a step 502. In step 504, symbol interleaving is performed by a block symbol interleaver having a P×N size with respect to the modulated symbol string 114. This symbol interleaving is performed in a manner that the block symbol interleaver conceptually having a two-dimensional P×N matrix arrangement in the horizontal direction performs writing in a row unit in the horizontal direction, and performs reading in a column unit in the vertical direction. By this, interleaving of the modulated symbol sequence 114 is performed. Next, in step 506, the interleaved modulated symbol sequence is sequentially segmented into N blocks each having P symbols. This data segmentation method 500 ends in step 508.

Further, the segment mapping section 120 illustrated in FIG. 1 performs mapping of the segmentation block 118 on a data domain of the RF carriers set 126. The segmentation block 118 can be allocated to the data domain of the RF carriers set 126 as follows [refer to IEEE 802.16m SDD, IEEE 802.16m-08/003r7, p. 147].

1) In the data domain of the RF carriers having the least logic RF carrier index, respective segmented blocks are mapped on one LRU from the least LRU index.

2) The mapping continues so as to increase the LRU index. When reaching the end of the data domain, the mapping continues from the least LRU index in the data domain of the RF carrier having next available logic RF carrier index.

3) The mapping continues until the entire segmented blocks are mapped.

In FIG. 1, in the set 124 of subcarrier mapping/IFFT sections, the respective subcarrier mapping/IFFT sections perform logic-physical mapping of LRU in a specified RF carrier of the RF carriers set 126. For example, the first subcarrier mapping/IFFT section 124a performs logical-physical mapping of LRU in the RF carrier 1-126a, and the k-th subcarrier mapping/IFFT section 124b performs logic-physical mapping of LRU in the RF carrier k-126b. In a multicarrier system, LRU is independently defined for each carrier. A specified PHY of the RF carrier executes subcarrier mapping based on LRU per carrier. Further, the respective subcarrier mapping/IFFT sections generate transmission data of the respective RF carriers 1-126a to k-126b for IFFT processing. By the above-described operation, the transmission data of the multicarrier is generated and output.

On the other hand, the receiver 150, in FIG. 2, executes an inverse operation that corresponds to the processing of the transmitter 100. The respective subcarrier demapping/FFT sections in the set 156 of subcarrier demapping/FFT sections restore a specified RF carrier of the RF carriers set 126 on the basis of the logical-physical mapping of the LRU through performing of the FFT process with respect to the received RF carriers set 126. The segment demapping section 158 restores the segmentation blocks 160 of the received modulated symbols which are mapped on the data domain of the RF carriers set 126 through demapping. The data assembly section 162 restores the modulated symbol sequence 164 by performing an inverse process to the data segmentation section 116 of the transmitter 100 with respect to plural segmentation blocks 160. At this time, the modulated symbol sequence 164 is assembled through performing of combination of the segmented blocks and symbol interleaving. The demodulator 166 generates subpackets 168 of the encoded data by performing demodulation of the modulated symbol sequence 164 according to a specified modulation method. The channel decoder 170 acquires the received data sequence, which is decoded by executing subblock deinterleaving and decoding of the subpackets 168 of the encoded data, by performing an inverse process to the channel encoder 108 of the transmitter 100.

Figure 7:
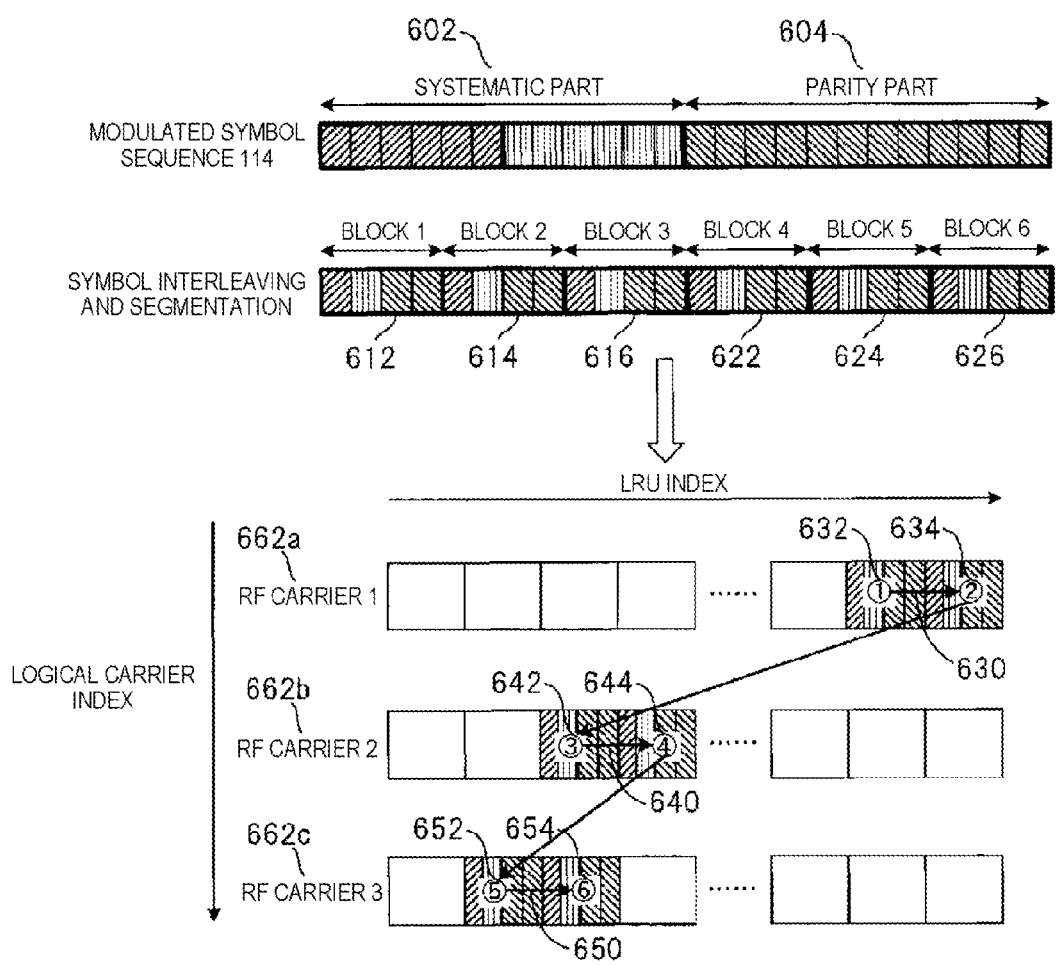
FIG. 7 is a diagram illustrating a processing example of the data segmentation method illustrated in FIGS. 6.

FIG. 7 is a diagram illustrating a processing example of the data segmentation method 500 illustrated in FIG. 6. Here, it is assumed that the number k of RF carriers is k=3, and the number of LRUs per RF carrier is 2. Accordingly, the total number N of LRUs allocated to the RF carriers set 126 is N=6.

As illustrated in FIGS. 6 and 7, after the symbol interleaving, the modulated symbol sequence 114 is successively segmented into six blocks 612, 614, 616, 622, 624, and 626 as the segment blocks 118. The first segmentation block 612 is mapped on the first LRU 632 of the data domain 630 in the RF carrier 1-662a. The second segmentation block 614 is mapped on the second LRU 634 of the data domain 630 in the RF carrier 1-662a. The third segmentation block 616 is mapped on the first LRU 642 of the data domain 640 in the RF carrier 2-662b. The fourth segmentation block 622 is mapped on the second LRU 644 of the data domain 640 in the RF carrier 2-662b. The fifth segmentation block 624 is mapped on the first LRU 652 of the data domain 650 in the RF carrier 3-662c. Further, the sixth segmentation block 626 is mapped on the second LRU 654 of the data domain 650 in the RF carrier 3-662c.

At this time, as illustrated in FIGS. 6 and 7, by the symbol interleaving, the systematic part 602 of the modulated symbol sequence 114 is almost equally allocated to the six blocks 612, 614, 616, 622, 624, and 626, respectively. Further, the parity part 604 of the modulated symbol sequence 114 is almost equally allocated to the six blocks 612, 614, 616, 622, 624, and 626, respectively. As the result, the systematic part 602 and the parity part 604 of the modulated symbol sequence 114 may be transmitted through the whole RF carriers. This improves the frequency diversity of the systematic bits and the parity bits. Accordingly, particularly in the case of high encoding rate, the CTC decoding performance can be improved.

However, under certain conditions, such as the FEC block size, the degree of modulation, the effective number of subcarriers in LRU, and the like, in the data segmentation method in the case of applying the above-described simple segmentation, the related systematic bits and parity bits may be biased to the same carrier. Where the FEC block size $N_{FB}$, the degree of modulation M, and the total number N of LRUs allocated to the RF carriers set 126 satisfy the conditions of the following equation (3), the above-described data segmentation method 500 has the following problems.

$$\text{Mod}(N_{FB}, 2 \times N \times M) = 0 \quad (3)$$

1) The related systematic bits A(i) and B(i) are always allocated to the same block/LRU.

2) Part of the parity bits $Y_1(i)$ (According to the length of the subpacket, $W_1(i)$ may be in the same manner), and their related systematic bits A(i) and B(i) are allocated to the same block/LRU.

Figure 8:
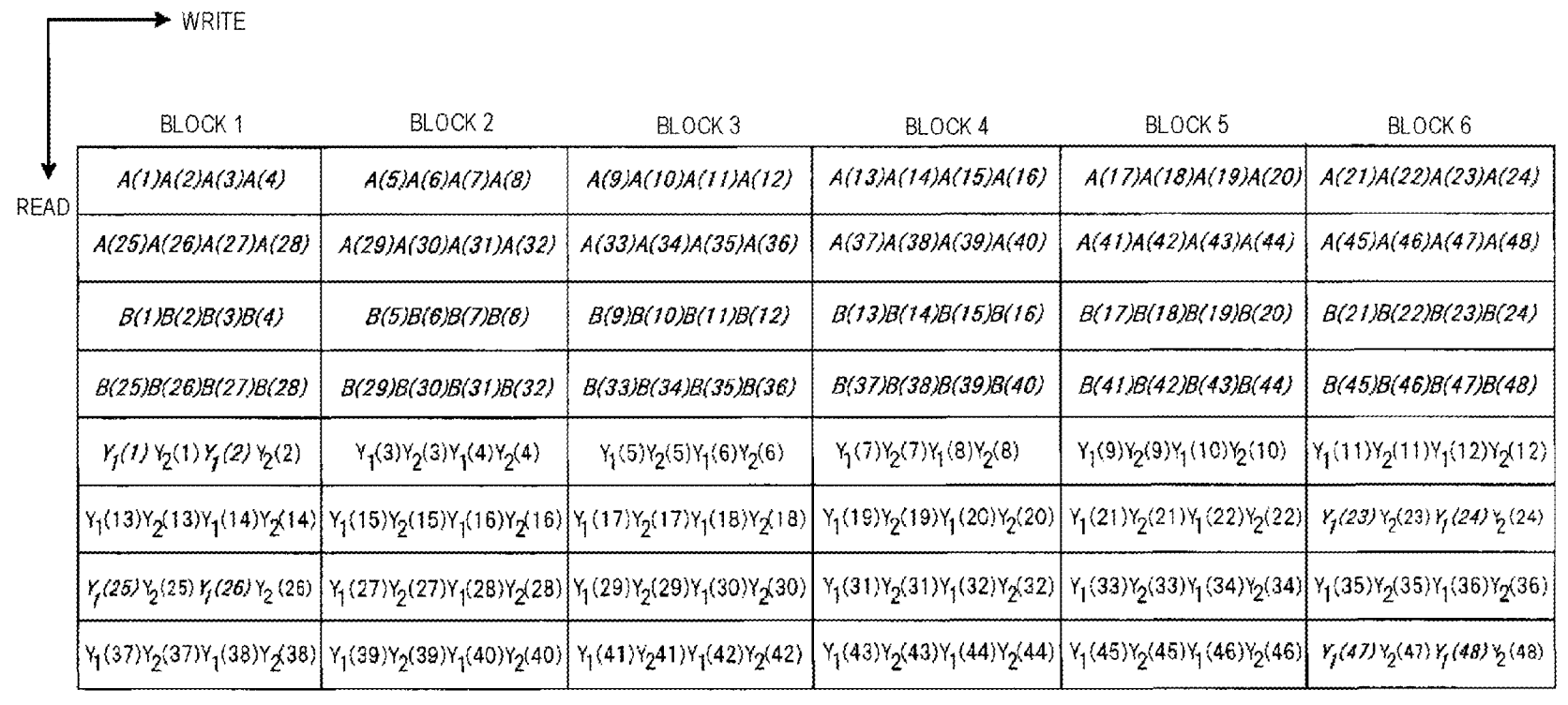

FIG. 8 is a diagram illustrating the arrangement example of segmentation blocks by the data segmentation method 500 in the case of applying the simple segmentation illustrated in FIGS. 6 and 7. In FIG. 8, for example, with respect to the respective subblock indexes i=1, 2, 23, 24, 25, 26, 47, and 48, the related systematic bits A(i) and B(i) and the parity bits $Y_1(i)$ and $Y_2(i)$ having the same i are allocated to the same block/LRU. Here, the FEC block size is $N_{FB}$=96, the degree of modulation is M=4, and the total number of LRUs is N=6. In FIG. 8, it is shown in italics that the related systematic bits and the parity bits are allocated to the same block/LRU.

As described above, according to the data segmentation method 500, since there is a possibility that the related systematic bits and the parity bits are allocated to the same RF carrier, it is not always possible to maximize the frequency diversity of the systematic bits and the parity bits. If such an RF carrier is under strong interference, the CTC decoding performance may be deteriorated.

Accordingly, in order to further improve the frequency diversity effect of the systematic bits and the parity bits in the multicarrier operation, it is necessary to develop a more effective data segmentation method. In the invention, an effective data segmentation method is provided so that the respective LRUs have almost the same number of systematic bits and parity bits and the related systematic bits and parity bits are allocated to different LRUs.

According to a main aspect of the invention, a method for segmenting a modulated symbol sequence is provided in an OFDMA multicarrier operation. This method includes the steps of i) grouping each part of J×K parts of the modulated symbol sequence into N groups and making the N groups of the same part have almost the same number of modulated symbols through the grouping, and performing cyclically shifting the respective N groups of any (K−1) parts that corresponds to an FEC block. Here, J is a specified number of FEC blocks that corresponds to the modulated symbol sequence, N is a specified number of allocated LRUs, and K is a positive integer that is predetermined to be any one of 3 and 4. K is determined by the coding rate of the transmission data (length of a subpacket) or the like, and indicates the number of parts of a specific portion of the modulated symbol sequence to be processed. For example, in the case where the mother code rate is ⅓ and is applied to the respective part of the subblocks of the systematic bits A and B and the parity bits $Y_1$ and $Y_2$. K becomes K=3, and further, in the case of inclusively applying the parts of the subblocks of the parity bits $W_1$ and $W_2$, K becomes K=4.

According to a main aspect of the invention, if the number of parts is K=3, the continuous specific part that corresponds to the FEC block is composed of the systematic part A, the systematic part B, and the parity part Y, which are prepared by the bit sequence of the systematic bits A, the bit sequence of the systematic bits B, and the bit sequence of the parity bits $Y_1$ and $Y_2$ by the CTC coding of the FEC block.

Further, if the number of parts is K=4, the continuous specific part that corresponds to the FEC block is composed of the systematic part A, the systematic part B, the parity part Y, and the parity part W, which are prepared by the bit sequence of the systematic bits A, the bit sequence of the systematic bits B, the bit sequence of the parity bits $Y_1$ and $Y_2$ by the CTC coding of the FEC block, and the bit sequence of the parity bits $W_1$ and $W_2$.

According to a main aspect of the invention, the groups of any one of (K−1) portions that correspond to the FEC blocks are cyclically shifted in the same direction with a different shift amount of (K−1).

Further, the groups of any one of (K−1) portions that correspond to the FEC blocks are cyclically shifted in an opposite direction with the same shift amount in the case of k=3.

At this time, the whole K parts may be cyclically shifted with different shift amounts, respectively. Here, if the shift amount of one part is set to 0 and other (K−1) parts are cyclically shifted in the same direction with different shift amounts, or in an opposite direction with the same shift amount, the same process as described above is performed.

As described above, according to an aspect of the invention, plural parts, which are divided into subblocks of the systematic part or the parity part, are grouped into plural groups having the same number as the plural parts, and the respective groups are cyclically shifted with different shift amounts between parts or with the same shift amount in an opposite direction. By using the cyclic shift in a group unit as described above, it is possible to disperse all segments with different indexes of the subblocks of the respective parts when the segmentation is performed by interlacing the systematic bits A(i) and B(i) and the parity bits $Y_1(i)$ and $Y_2(i)$. If the cyclic shift is performed with different shift amounts, the arrangements are obtained inevitably in different orders. Further, in the case of applying the cyclic shift, it is not necessary to individually perform the setting of the arrangement with different indexes in the respective segments, and thus the memory capacity or processing load can be reduced.

The above and other features and advantages of the invention will be better understood by the following detailed description together with the accompanying drawings and claims.

Here, diverse embodiments of the invention will be described in detail using the accompanying drawings. In the following explanation, the detailed explanation of the same function and configuration will be omitted for clearness and simplicity (First Embodiment)

Figure 9:
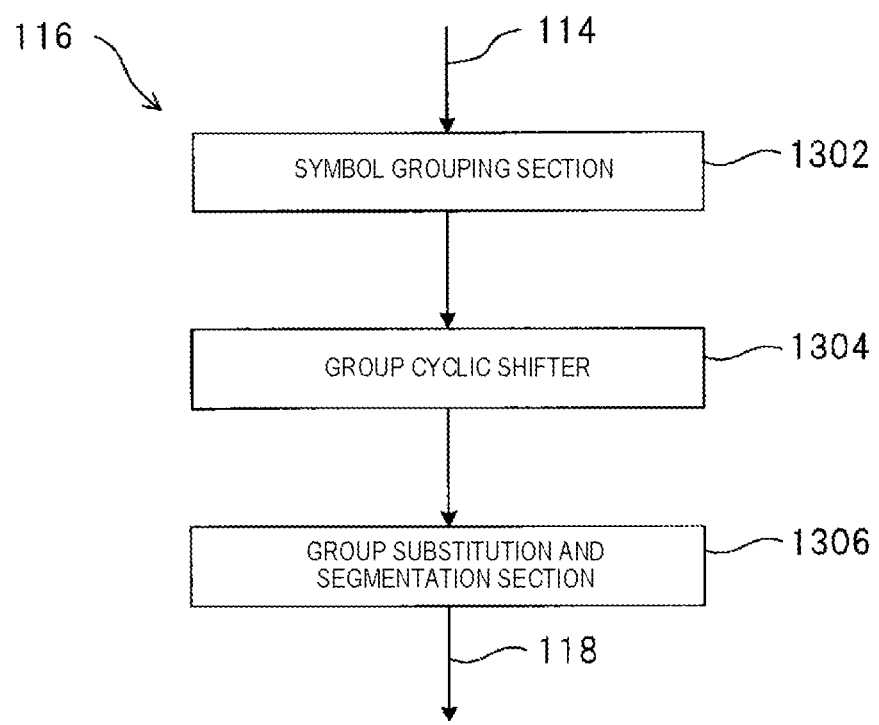
FIG. 9 is a Nock diagram illustrating the configuration of a data segmentation section according to an embodiment of the invention.

FIG. 9 is a block diagram illustrating the configuration of a data segmentation section according to an embodiment of the invention. The data segmentation section 116 includes a symbol grouping section 1302, a group cyclic shifter 1304, a group substitution and segmentation section 1306. The symbol grouping section 1302 performs grouping of a specified part of the modulated symbol sequence into N groups. The specified part of the modulated symbol sequence may be the systematic part A, systematic part B, parity part Y and parity part W, or one parity part. The group cyclic shifter 1304 performs cyclic shift of the groups of the specified part of the modulated symbol sequence with a specified shift amount and in a specified shift direction. The group substitution and segmentation section 1306 performs segmentation of the modulated symbol sequence of the plural groups after the cyclic shift into plural blocks by performing mutual interlacing (group substitution) between parts of the specified part. Here, the group substation and the segmentation that are performed by the group substitution and segmentation section 1306 may be performed using the same procedure as the symbol interleaving and segmentation illustrated in FIGS. 6 and 7.

Figure 10:
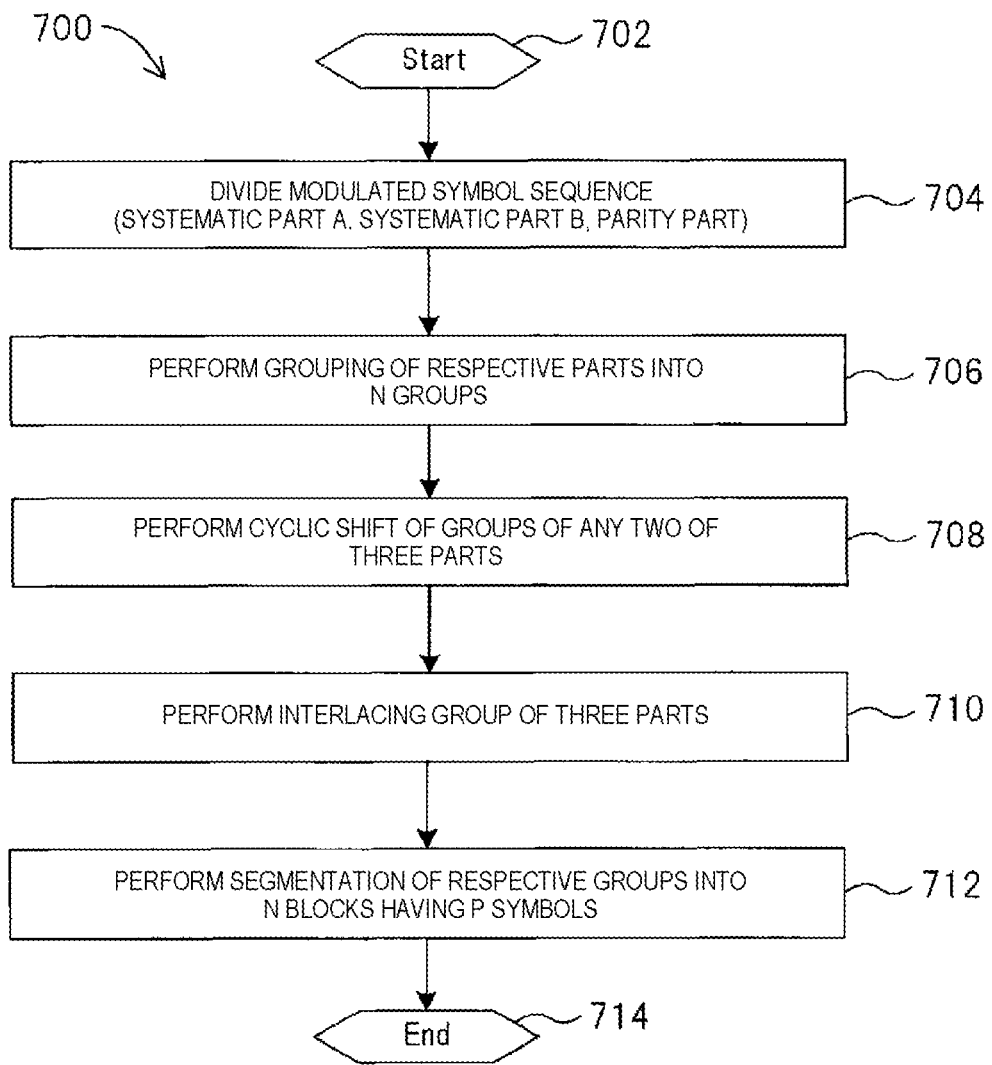
FIG. 10 is a flowchart illustrating a data segmentation method according to a first embodiment of the invention.
Figure 11:
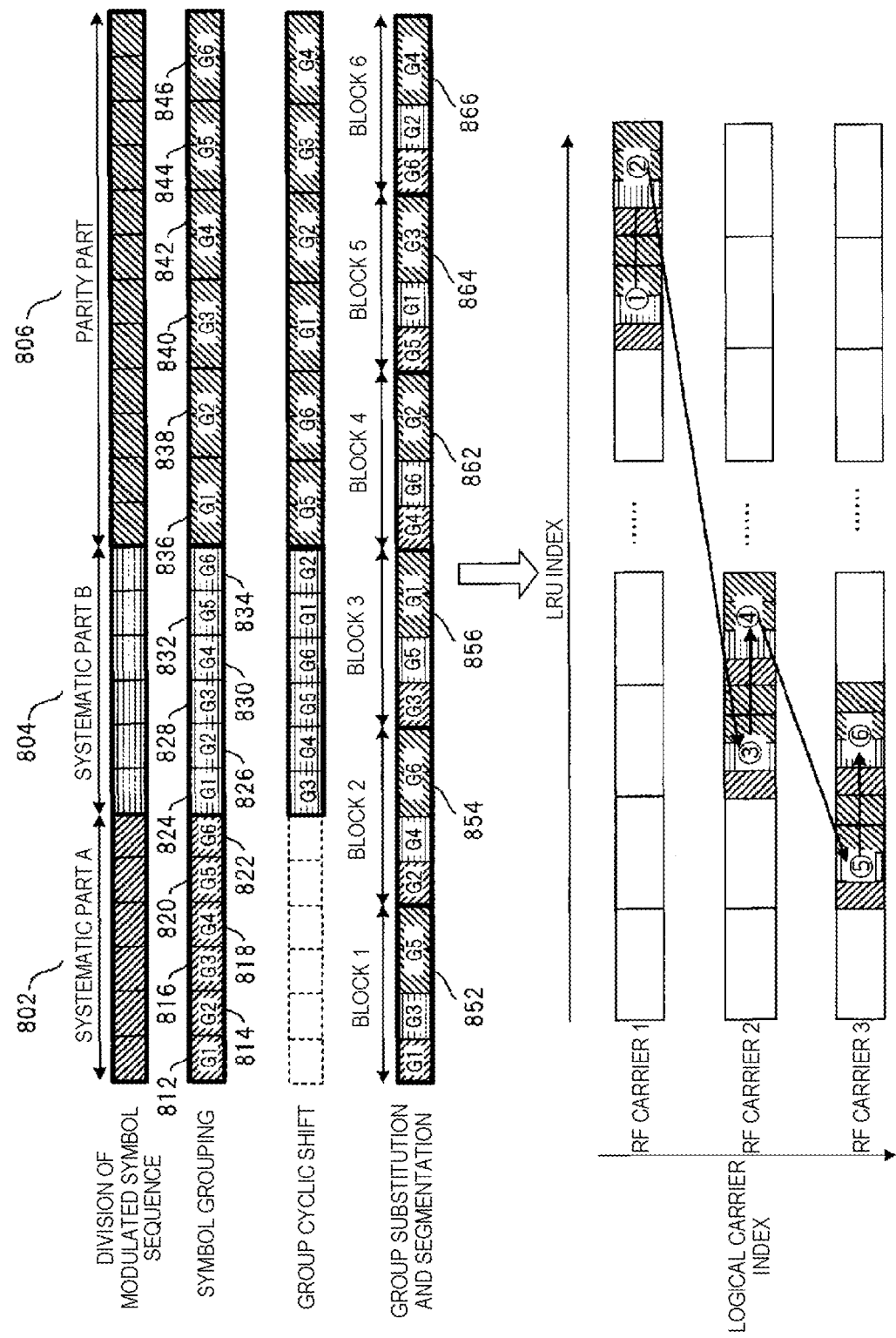
FIG. 11 is a diagram illustrating the processing example of the data segmentation method according to the first embodiment of the invention.

FIG. 10 is a flowchart illustrating a data segmentation method 700 according to a first embodiment of the invention, and FIG. 11 is a diagram illustrating the processing example of the data segmentation method 700 according to the first embodiment of the invention. In the first embodiment, a case where the number K of parts of the specified part of the modulated symbol sequence to be processed is K=3 in the data segmentation section 116. In this case, the group cyclic shift is performed with respect to the groups of (K−1)=2 parts.

As illustrated in FIGS. 10 and 11, the data segmentation method 700 that is performed by the data segmentation section 116 according to the first embodiment starts from step 702. In step 704, the symbol grouping section 1302 divides the modulated symbol sequence into three parts of a systematic part A 802, a systematic part B 804, and a parity part 806. The systematic part A 802 includes modulated symbols that are prepared by the bit sequence of the systematic bit A. The systematic part B 804 mainly includes the modulated symbols that are prepared by the bit sequence of the systematic bit B. Further, the parity part 806 mainly includes the modulated symbols that are prepared by the bit sequences of the parity bit $Y_1$ and the parity bit $Y_2$. Here, the parity part 806 may include the modulated symbols that are prepared by the bit sequences of the parity bit $W_1$ and the parity bit $W_2$ according to the length of the subpacket.

In step 706, the symbol grouping section 1302 performs grouping of the systematic part A 802, the systematic part B 804, and the parity part 806 into N groups. Here, it is assumed that the total number of LRUs is N=6. More specifically, as illustrated in FIG. 11, the systematic part A 802 is segmented into six groups G1 to G6, that is, groups 812, 814, 816, 818, 820, and 822. The systematic part B 804 is segmented into six groups G1 to G6, that is, groups 824, 826, 828, 830, 832, and 834. Further, the parity part 806 is segmented into six groups G1 to G6, that is, groups 836, 838, 840, 842, 844, and 846. Hereinafter, the symbol grouping procedure in step 706 will be described in detail.

It is assumed that the systematic part A 802 and the systematic part B 804 have the same length that is determined by the following equation (4).

$$L_S = \lfloor N_{FB}/(2 \times M) \rfloor \quad (4)$$

Here, $\lfloor \; \rfloor$ represents a floor operator, and $\lfloor X \rfloor$ represents a floor operation of X. The same applies to the following.

Based on the equation (2) and the equation (4), the length of the parity part 806 is given by the following equation (5).

$$L_P = P \times N - 2 \times L_S \quad (5)$$

The length $L_S$ of the systematic part A 802 (or the systematic part B 804) may be again represented by the following equation (6).

$$L_S = a_1 \times N + b_1 = a_1 \times (N-b_1) + (a_1+1) \times b_1 \quad (6)$$

Here, $a_1$ and $b_1$ are integers.

Accordingly, the length $L_P$ of the parity part 806 may be represented by the following equation (7).

$$L_P = (P-2a_1) \times N - 2b_1 = (P-2a_1) \times (N-b_1) + (P-2a_1-2) \times b_1 \quad (7)$$

From the above-described equation (6) and equation (7), it can be easily understood that the systematic part A 802 (or the systematic part B 804) may be divided into N groups having at least two different sizes, that is, a group $(N-b_1)$ of a symbol having a size al and a group $b_1$ of a symbol having a size $(a_1+1)$. Further, the parity part 806 may be divided into N groups having at least two different sizes, that is, a group $(N-b_1)$ of a symbol having a size $(P-2a_1)$ and a group $b_1$ of a symbol having a size $(P-2a_1-2)$. Here, if $b_1$ is $b_1=0$, only a single group size exists with respect to the systematic part A 802, the systematic part B 804, and the parity part 806. Further, in the case where two different sizes exist, the difference between the two sizes is at least 2 symbols.

With respect to the systematic part A 802 (or systematic part B 804), a group $(N-b_1)$ of a symbol having a size $a_1$ may be initially formed, and then a group $b_1$ of a symbol having a size $(a_1+1)$ may be formed. With respect to the parity part 806, a group $(N-b_1)$ of a symbol having a size $(P-2a_1)$ may be initially formed, and then a group $b_1$ of a symbol having a size $(P-2a_1-2)$ may be formed.

Further, with respect to the systematic part A 802 (or systematic part B 804), a group $b_1$ of a symbol having a size $(a_1+1)$ may be initially formed, and then a group $(N-b_1)$ of a symbol having a size al may be subsequently formed. With respect to the parity part 806, a group $b_1$ of a symbol having a size $(P-2a_1-2)$ may be initially formed, and then a group $(N-b_1)$ of a symbol having a size $(P-2a_1)$ may be formed.

Next, in step 708, by the group cyclic shifter 1304, groups of any two of three parts of the systematic part A802, the systematic part B 804, and the parity part 806, are cyclically shifted with a specified shift amount in different directions. The preferable value of the specified shift amount is $\lfloor N/3 \rfloor$ group.

Further, in step 708, it is also possible that by the group cyclic shifter 1304, groups of any two parts of the systematic part A 802, the systematic part B 804, and the parity part 806, are cyclically shifted with two specified different shift amounts in the same direction. The two preferable values are $\lfloor N/3 \rfloor$ and $2\times\lfloor N/3 \rfloor$. In this case, the processing delay of the data segmentation and mapping process in the transmitter and the data assembly and demapping process in the receiver can be reduced.

In an example of FIG. 11, the groups of the systematic part B 804 and the parity part 806 are cyclically shifted. In the case where the group cyclic shift is executed in different directions with respect to the systematic part B 804 and the parity part 806, the shift amount is two groups. In the case where the group cyclic shift is executed in the same direction with respect to the systematic part B 804 and the parity part 806, the shift amount with respect to the systematic part B 804 is four groups, and the shift amount with respect to the parity part 806 is two groups.

Next, in step 710, the group substitution is executed by interlacing the systematic part A 802, the systematic part B 804, and the parity part 806 together through the group substitution and segmentation section 1306. Then, in step 712, the interlaced groups are sequentially segmented into N blocks, each block having P symbols by the group substitution and segmentation section 1306. This data segmentation method 700 ends in step 714.

In the receiver 150, by executing the inverse operation that corresponds to the process of the transmitter 100, the data sequence to be received, which is processed opposite to the process of the transmitter 100 and then transmitted, is generated. Here, the data assembly section 162 restores and assembles the modulated symbol sequence from the plural segmentation blocks through an opposite process to the above-described data segmentation method 700. That is, the data assembly section 162 assembles the modulated symbol sequence in its original state by performing combination and inverse substitution of the plural segmented blocks, the group cyclic shift in reverse direction, unification of respective grouped parts, and combination of the modulated symbol sequence.

As illustrated in FIG. 11, after the group substitution and segmentation, the first block 852 includes group 1 (G1) 812 of the systematic part A 802, group 3 (G3) 828 of the systematic part B 804, and group 5 (G5) 844 of the parity part 806. The second block 854 includes group 2 (G2) 814 of the systematic part A 802, group 4 (G4) 830 of the systematic part B 804, and group 6 (G6) 846 of the parity part 806. The third block 856 includes group 3 (G3) 816 of the systematic part A 802, group 5 (G5) 832 of the systematic part B 804, and group 1 (G1) 836 of the parity part 806. The fourth block 862 includes group 4 (G4) 818 of the systematic part A 802, group 6 (G6) 834 of the systematic part B 804, and group 2 (G2) 806 of the parity part 806. The fifth block 864 includes group 5 (G5) 820 of the systematic part A 802, group 1 (G1) 824 of the systematic part B 804, and group 3 (G3) 840 of the parity part 806. The sixth block 866 includes group 6 (G6) 822 of the systematic part A 802, group 2 (G2) 826 of the systematic part B 804, and group 4 (G4) 842 of the parity part 806.

According to the data segmentation method 700, by the symbol grouping, the group cyclic shift, the group substitution and segmentation as illustrated in FIGS. 10 and 11, the systematic part A 802, the systematic part B 804, and the parity part 806 are allocated to the same block/LRU almost equally. Further, by the group cyclic shift, the parity bit $Y_1(i)$ and the systematic bits A(i) and B(i) related to the parity bit $Y_1(i)$ are always allocated to different blocks/LRUs.

FIG. 12 is a diagram illustrating the arrangement example of segmentation blocks by the data segmentation method 700 to which the symbol grouping and the group cyclic shift are applied according to this embodiment illustrated in FIGS. 10 and 11. In FIG. 12, for example, with respect to the indexes i=1, 2, 23, 24, 25, 26, 47, and 48 of the respective subblocks, the related systematic bits A(i) and B(i) and the parity bits $Y_1(i)$ having the same i are allocated to the different blocks/LRUs. Here, the FEC block size is $N_{FB}$=96, the degree of modulation is M=4, and the total number of LRUs is N=6.

By this, the related systematic bits and parity bits are transmitted to different RF carriers as far as possible. Accordingly, the data segmentation method 700 illustrated in FIG. 10 can improve the frequency diversity effect of the systematic bits and the parity bits in comparison to the simple data segmentation method 500 illustrated in FIG. 6.

(Second Embodiment)

A second embodiment represents an example in the case of increasing the length of the subpacket as compared with the first embodiment. If the length of the subpacket is increased, such as the coding rate of the transmission data is less than ½, the parity part of the modulated symbol sequence may include the modulated symbols which are prepared by the bit sequence of the parity bit $W_1$ or $W_2$ in addition to the bit sequence of the parity bits $Y_1$ and $Y_2$. Further, the parity bit $W_1(i)$ having the same i is related to the systematic bits A(i) and B(i) and the parity bit $Y_1(i)$. In this case, for the purpose of further improving the frequency diversity effect of the systematic bits and the parity bits, it is reasonable to allocate the related systematic/parity bits A(i), B(i), $Y_1(i)$, and W1(i) to different blocks/LRUs.

Figure 13:
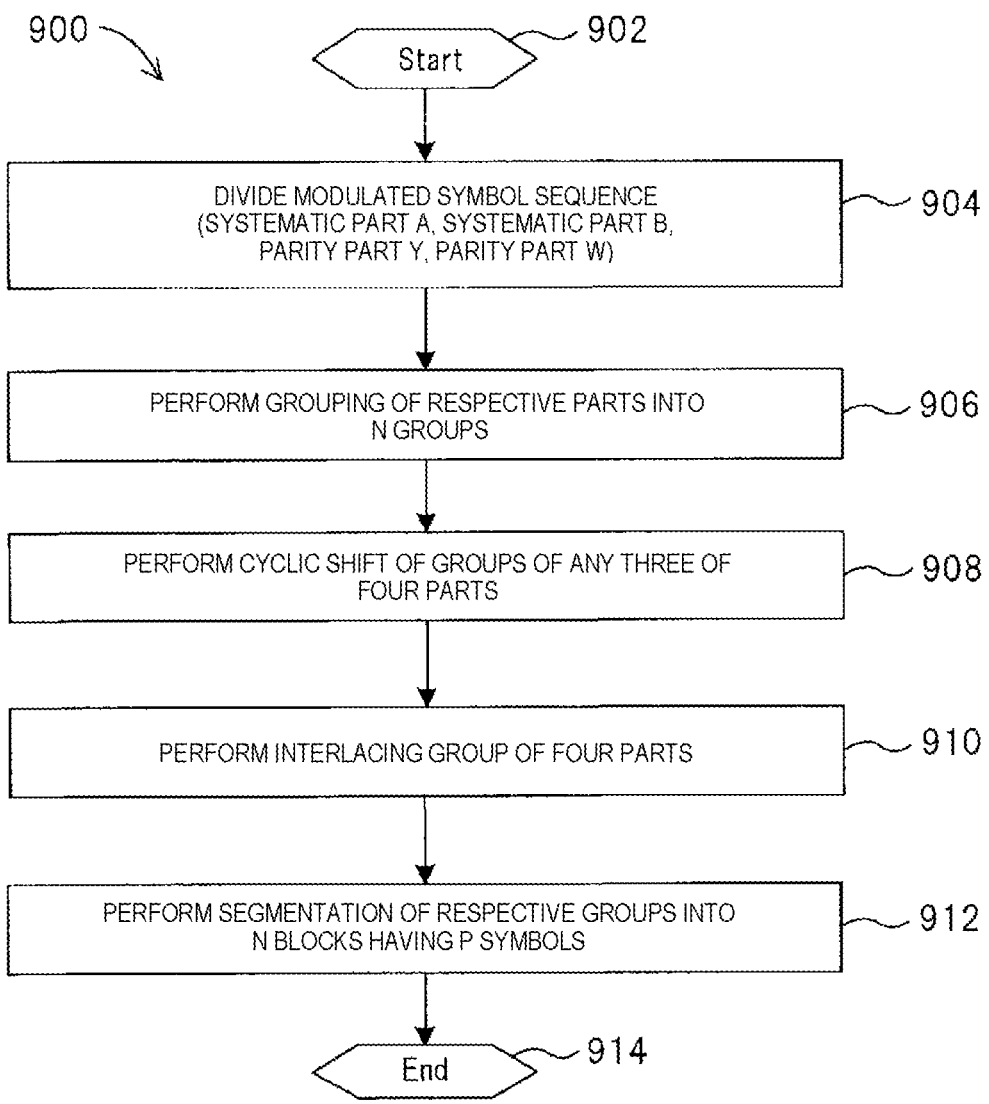
FIG. 13 is a flowchart illustrating a data segmentation method according to a second embodiment of the invention.
Figure 14:
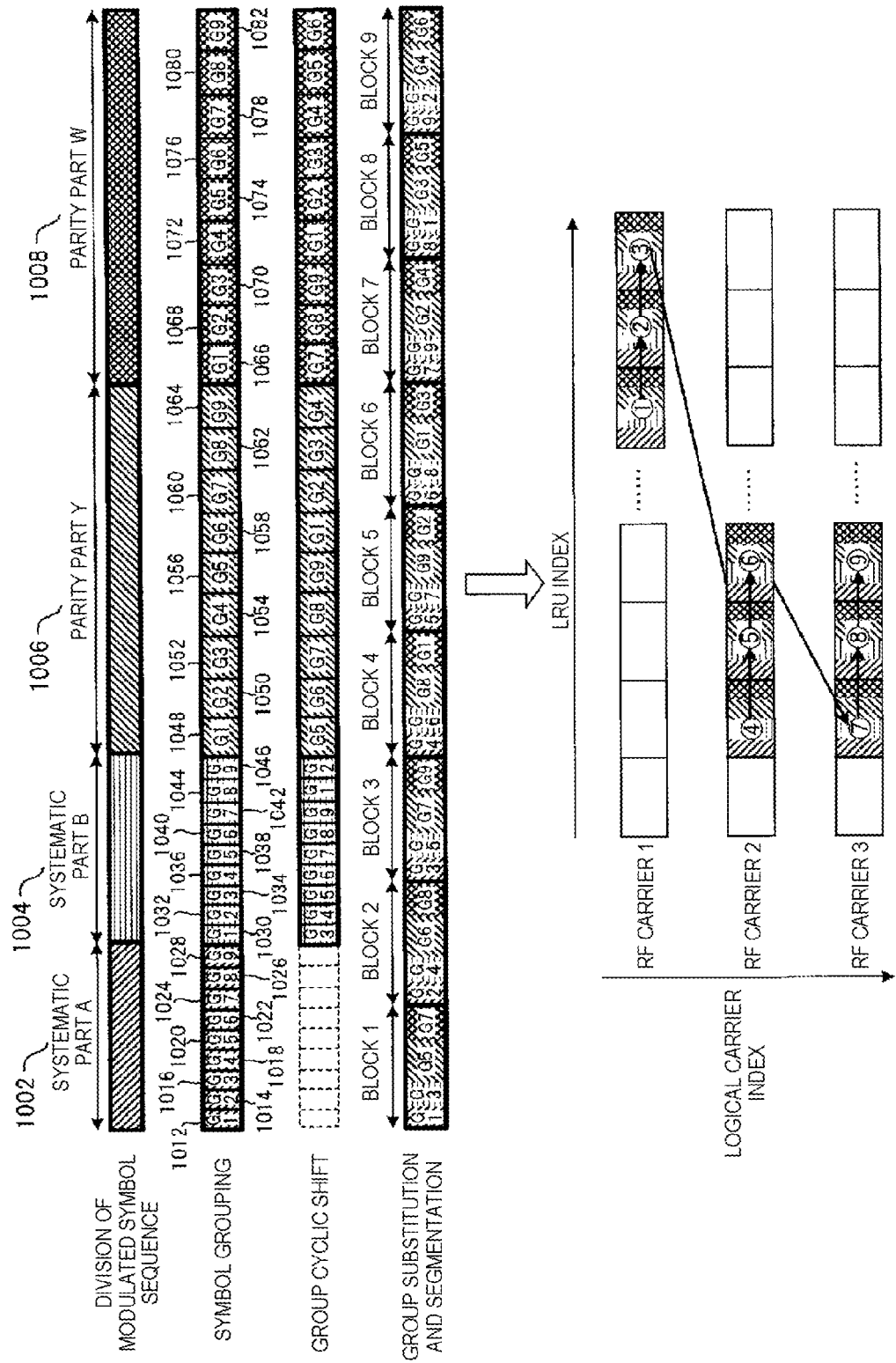
FIG. 14 is a diagram illustrating the processing example of the data segmentation method according to the second embodiment of the invention.

FIG. 13 is a flowchart illustrating a data segmentation method 900 according to the second embodiment of the invention. FIG. 14 is a diagram illustrating the processing example of the data segmentation method 900 according to the second embodiment of the invention. In the second embodiment, a case where the number of parts K of the specified part of the modulated symbol sequence to be processed is K=4 in the data segmentation section 116. In this case, the group cyclic shift is performed with respect to the groups of the (k−1)=3 parts.

As illustrated in FIGS. 13 and 14, the data segmentation method 900 according to the data segmentation section 116 of the second embodiment starts from step 902. In step 904, the symbol grouping section 1302 divides the modulated symbol sequence into four parts of a systematic part A 1002, a systematic part B 1004, a parity part Y 1006, and a parity part W 1008. The parity part Y 1006 includes the modulated symbols that are prepared by the bit sequences of the parity bit $Y_1$ and the parity bit $Y_2$, and the parity part W 1008 includes the modulated symbols that are prepared by the bit sequences of the parity bit $W_1$ and the parity bit $W_2$.

In step 906, the symbol grouping section 1302 performs grouping of the systematic part A 1002, the systematic part B 1004, the parity part Y 1006, and the parity part W 1008 into N groups, respectively. Here, it is assumed that the total number of LRUs is N=9. More specifically, as illustrated in FIG. 14, the systematic part A 1002 is divided into nine groups G1 to G9, that is, groups 1012, 1014, 1016, 1018, 1020, 1022, 1024, 1026, and 1028. The systematic part B 1004 is divided into nine groups G1 to G9, that is, groups 1030, 1032, 1034, 1036, 1038, 1040, 1042, 1044, and 1046. Further, the parity part Y 1006 is divided into nine groups G1 to G9, that is, groups 1048, 1050, 1052, 1054, 1056, 1058, 1060, 1062, and 1064. Further, the parity part W 1008 is divided into nine groups G1 to G9, that is, groups 1066, 1068,

1070, 1072, 1074, 1076, 1078, 1080, and 1082. Hereinafter, the symbol grouping procedure in step 906 will be described in detail.

Here, the length $L_S$ of the systematic part A 1002 (or systematic part B 1004) is defined by the above-described equation (4), and can be represented by the equation (6). Accordingly, the symbol grouping procedure of the systematic part A 1002 (or systematic part B 1004) is the same as the systematic part A 802 (or systematic part B 804) as illustrated in FIG. 10.

The length of the parity part Y 1006 may be given by the following equation (8) using the length Ls of the systematic part.

$$L_Y = 2 \times L_S \tag{8}$$

Further, based on the above-described equations (2) and (8), the length of the parity part W 1008 is given by the following equation (9).

$$L_W = P \times N - 4 \times L_S \tag{9}$$

According to the equation (6), the length Ly of the parity part Y 1006 may be represented by the following equation (10).

$$L_Y = 2a_1 \times N + 2b_1 = 2a_1 \times (N-b_1) + (2a_1+2) \times b_1 \tag{10}$$

Further, the length Lw of the parity bit W 1008 may be represented by the following equation (11).

$$L_W = (P-4a_1) \times N - 4b_1 = (P-4a_1) \times (N-b_1) + (P-4a_1-4) \times b_1 \tag{11}$$

From the above-described equations (10) and (11), it can be easily understood that the parity part Y 1006 may be divided into N groups having at least two different sizes, that is, a group $(N-b_1)$ of a symbol having a size $2a_1$ and a group $b_1$ of a symbol having a size $(2a_1+2)$. Further, the parity part W 1008 may be divided into N groups having at least two different sizes, that is, a group $(N-b_1)$ of a symbol having a size $(P-4a_1)$ and a group $b_1$ of a symbol having a size $(P-4a_1-4)$. Here, if $b_1$ is $b_1=0$, only a single group size exists with respect to the parity part Y 1006 and the parity part W 1008. Further, in the case where two different sizes exist, the difference between the two sizes is at least 4 symbols.

With respect to the parity part Y 1006, a group $(N-b_1)$ of a symbol having a size $2a_1$ may be initially formed, and then a group $b_1$ of a symbol having a size $(2a_1+2)$ may be formed. With respect to the parity part W 1008, a group $(N-b_1)$ of a symbol having a size $(P-4a_1)$ may be initially formed, and then a group $b_1$ of a symbol having a size $(P-4a_1-4)$ may be formed.

Further, with respect to the parity part Y 1006, a group $b_1$ of a symbol having a size $(2a_1+2)$ may be initially formed, and then a group $(N-b_1)$ of a symbol having a size $2a_1$ may be subsequently formed. With respect to the parity part W 1008, a group $b_1$ of a symbol having a size $(P-4a_1)$ may be initially formed, and then a group $(N-b_1)$ of a symbol having a size $(P-4a_1)$ may be formed.

Next, in step 908, by the group cyclic shifter 1304, groups of any three of four parts, the systematic part A 1002, the systematic part B 1004, the parity part Y 1006, and the parity part W 1008, are cyclically shifted with three specified shift amounts in the same direction. The preferable values of these shift amounts are $\lfloor N/4 \rfloor$, $2 \times \lfloor N/4 \rfloor$, and $3 \times \lfloor N/4 \rfloor$ groups, respectively.

In an example of FIG. 14, the groups of the systematic part B 1004, the parity part Y 1006, and the parity part W 1008 are cyclically shifted. In this case, the shift amount of the systematic part B 1004 is two groups, the shift amount of the parity part Y 1006 is four groups, and the shift amount of the parity part W 1008 is six groups.

Next, in step 910, the group substitution is executed by interlacing the systematic part A 1002, the systematic part B 1004, the parity part Y 1006, and the parity part W 1008 together through the group substitution and segmentation section 1306. Then, in step 912, the interlaced groups are sequentially segmented into N blocks having P symbols, respectively, by the group substitution and segmentation section 1306. This data segmentation method 900 ends in step 914.

According to the data segmentation method 900, by the symbol grouping, the group cyclic shift, the group substitution and the segmentation as illustrated in FIGS. 13 and 14, the systematic part A 1002, the systematic part B 1004, the parity part Y 1006, and the parity part W 1008 are allocated to the same block/LRU almost equally. Further, by the group cyclic shift, the parity bits Yi(i) and Wi(i) and the systematic bits A(i) and B(i) related to the parity bits are always allocated to different blocks/LRUs.

By this, the related systematic/parity bits A(i), B(i), $Y_1(i)$, and $W_1(i)$ are transmitted to different RF carriers as far as possible. Accordingly the data segmentation method 900 illustrated in FIG. 13 can improve the frequency diversity effect of the systematic bits and the parity bits in comparison to the data segmentation method 700 illustrated in FIG. 10.

(Third Embodiment)

A third embodiment represents an example in the case of applying to a plurality of FEC blocks as compared with the first embodiment.

Generally, in the case where the PHY PDU exceeds the maximum FEC block size, the data sequence is divided into a lot of FEC blocks, and the respective FEC blocks are separately encoded. The data segmentation method 700 illustrated in FIG. 10 and the data segmentation method 900 illustrated in FIG. 13 can be applied to the case of the single FEC block per PHY PDU. Accordingly, an example that is applicable to a plurality of FEC blocks per PHY PDU is shown below.

Figure 15:
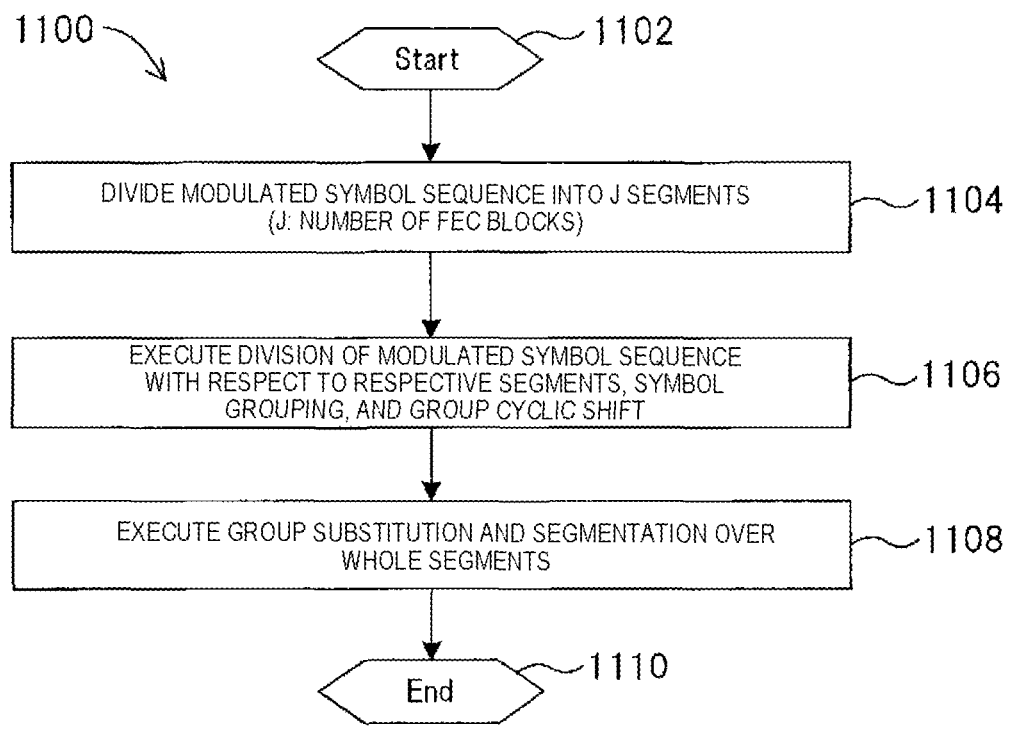
FIG. 15 is a flowchart illustrating a data segmentation method according to a third embodiment of the invention.
Figure 16:
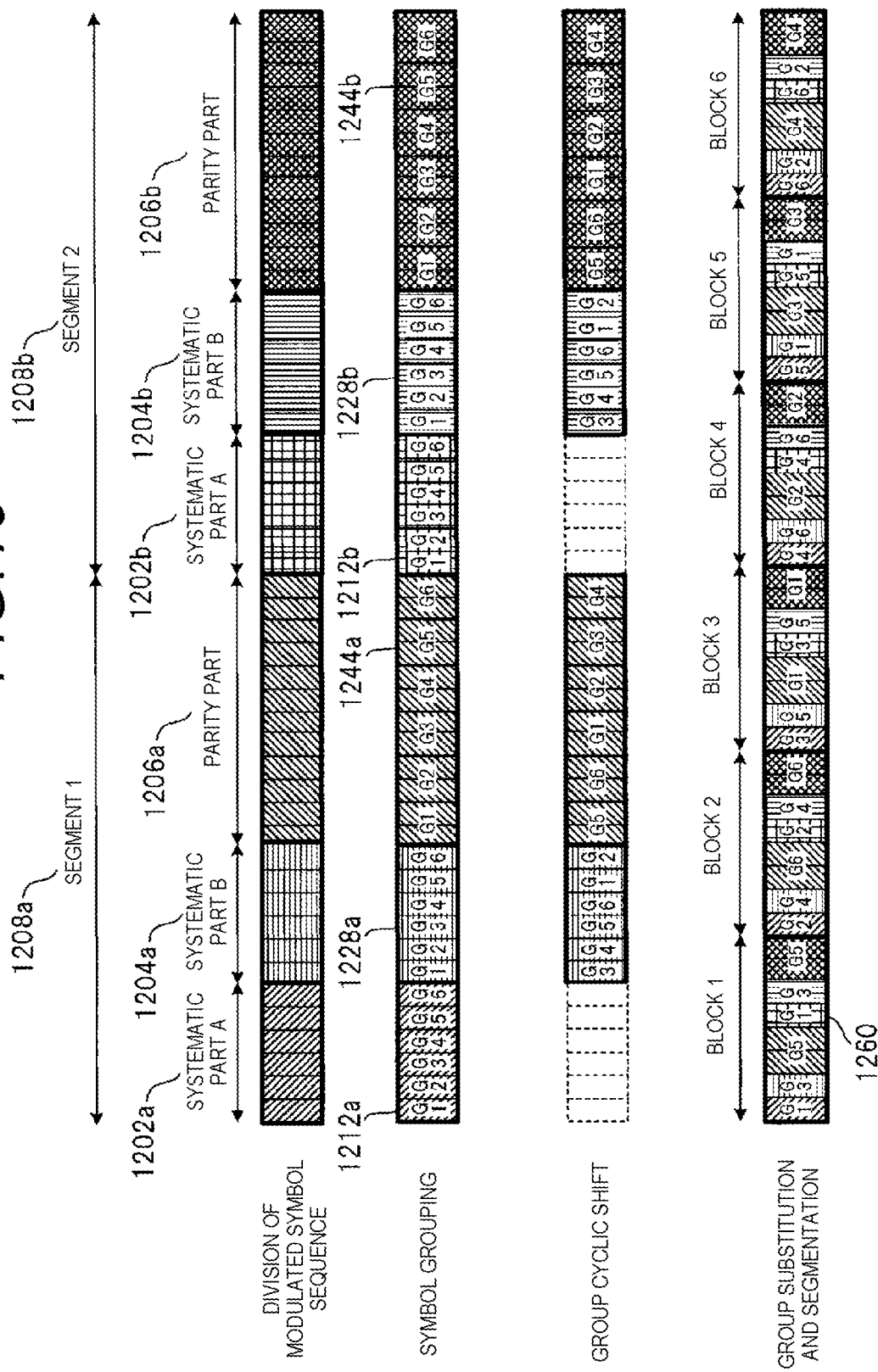
FIG. 16 is a diagram illustrating the processing example of the data segmentation method according to the third embodiment of the invention.
Figure 17:
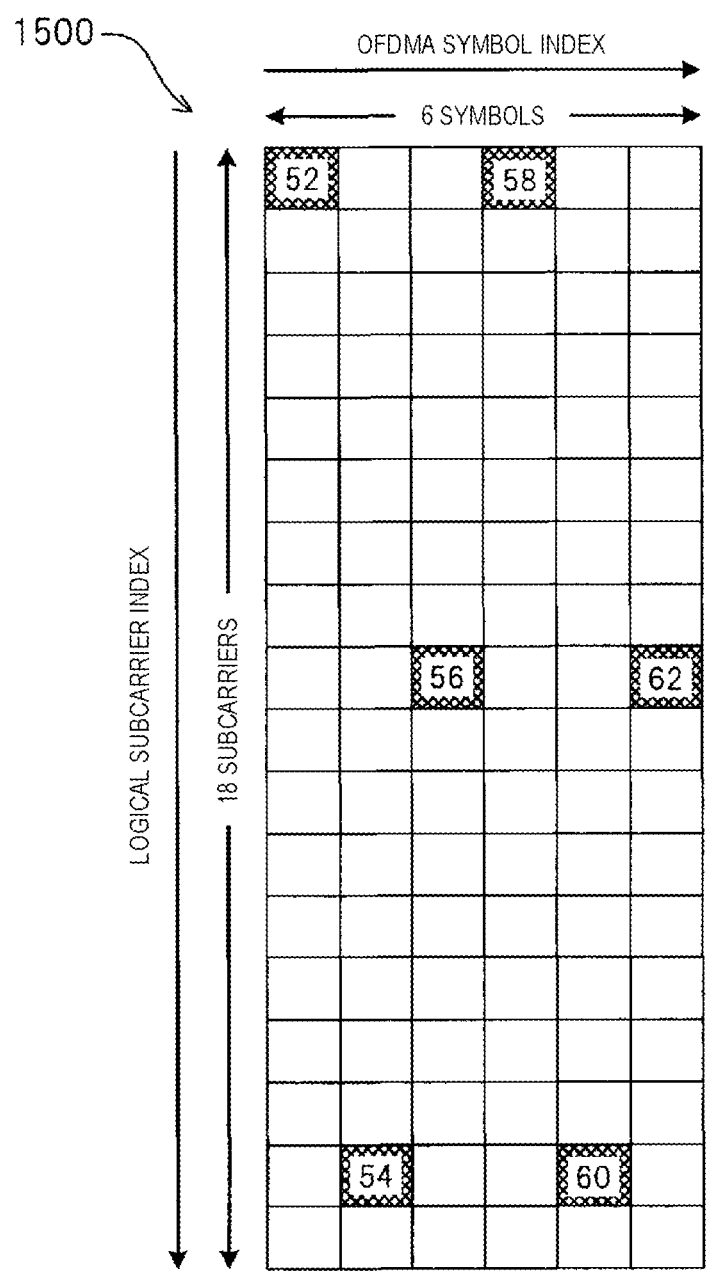
FIG. 17 is a diagram exemplifying LRU in an OFDMA multicarrier operation.
Figure 18:
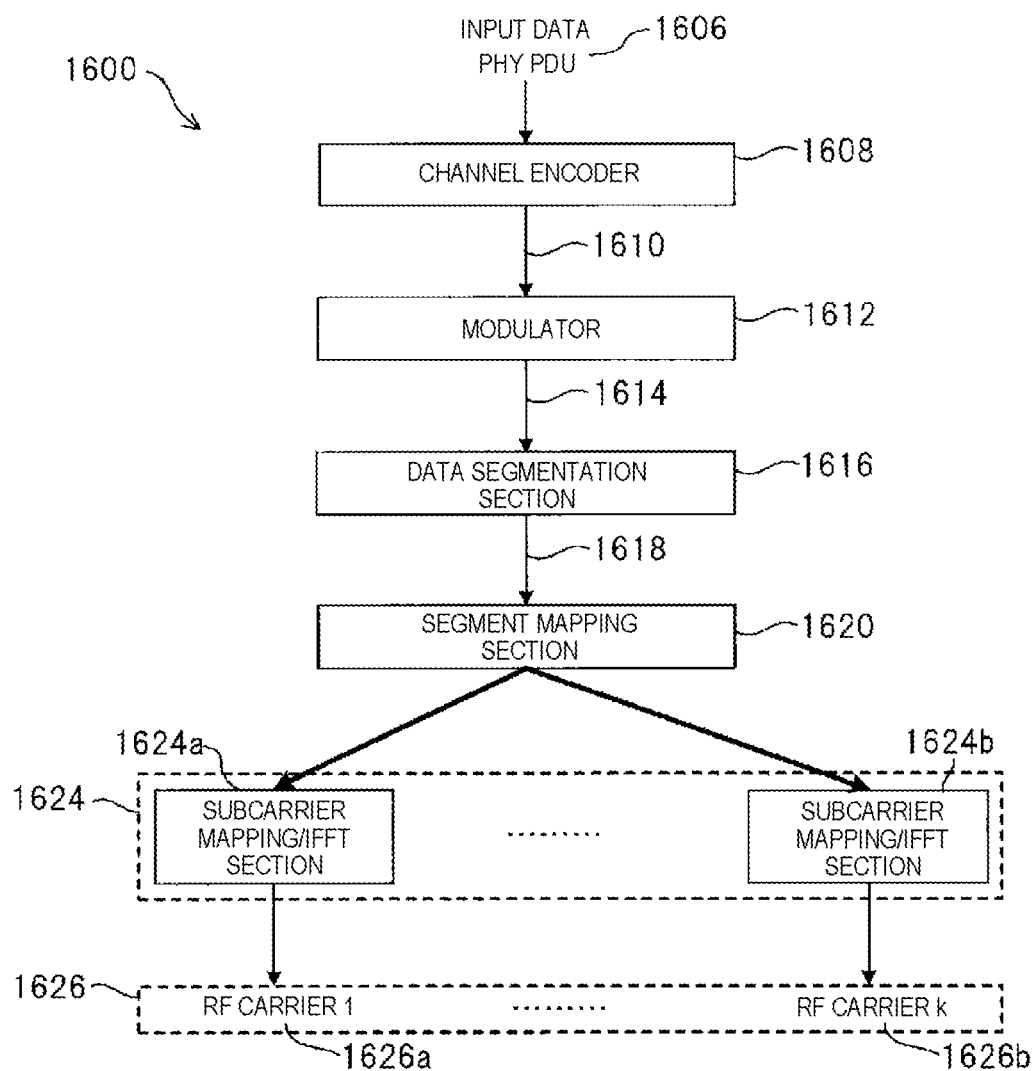
FIG. 18 is a block diagram illustrating the configuration example of a transmitter compatible with the multicarrier operation.

FIG. 15 is a flowchart illustrating a data segmentation method 1100 according to the third embodiment of the invention, and FIG. 16 is a diagram illustrating the processing example of the data segmentation method 1100 according to the third embodiment of the invention. In the third embodiment, a case where the number K of parts of the specified part of the modulated symbol sequence to be processed in the data segmentation section 116 is K=3 is shown. Further, the number J of segments that correspond to the plural FEC blocks is J=2. In this case, the group cyclic shift is performed with respect to the groups of the (K−1)=2 parts in two segments.

As illustrated in FIGS. 15 and 16, the data segmentation method 1100 that is performed by the data segmentation section 116 according to the third embodiment starts from step 1102. In step 1104, the symbol grouping section 1302 divides the modulated symbol sequence into J segments. Here, J=2 represents the number of FEC blocks, and the j-th segment corresponds to the j-th FEC block.

Next, in step 1106, in the same manner as the single FEC block per PHY PDU in the first and second embodiments as described above, the division of the modulated symbol sequence, the symbol grouping, and the group cyclic shift are executed with respect to the J segments by the symbol grouping section 1302 and the group cyclic shifter 1304. That is, execution is made in the same manner as the steps 704, 706, and 708 of the data segmentation method 700 and the steps 904, 906, and 908 of the data segmentation method 900.

Then, in step 1108, by the group substitution and segmentation section 1306, the group substitution and segmentation is executed over all segments of the modulated symbol sequence. As illustrated in FIG. 16, for example, the first block (block 1) 1260 includes the third group of the first segment (segment 1) 1208*a*, that is, group 1 (G1) 1212*a* of the systematic part A 1202*a*, group 3 (G3) 1228*a* of the systematic part B 1204*a*, and group 5 (G5) 1244*a* of the parity part 1206*a*, and the third group of the second segment (segment 2) 1208*b*, that is, group 1 (G1) 1212*b* of the systematic part A 1202*b*, group 3 (G3) 1228*b* of the systematic part B 1204*b*, and group 5 (G5) 1244*b* of the parity part 1206*b*.

In this case, since the group substitution is executed over the whole segments of the modulated symbol sequence, it is possible to improve the CTC decoding performance with respect to the respective FEC blocks.

According to the above-described data segmentation method 1100, in the case of using plural FEC blocks, in the same manner as the data segmentation methods 700 and 900, the related systematic/parity bits are always allocated to different blocks/LRUs. Accordingly, the related systematic/parity bits are transmitted to different RF carriers as far as possible, and thus the frequency diversity effect of the systematic bits and the parity bits can be improved.

As described above, according to the respective embodiments, the symbol grouping, the group cyclic shift, the group substitution and segmentation are performed when the modulated symbol sequence is mapped on the plural RF carriers for the multicarrier operation, and thus the related systematic bits and parity bits are prevented from being biased to the same carrier. Accordingly, it becomes possible to distribute and transmit the related systematic bits and parity bits to different RF carriers as far as possible. Accordingly, on the reception side, the decoding performance such as error correction capability can be improved, and the frequency diversity effect can be maximized.

Diverse modifications and applications may be made by those of skilled in the art based on the description of the specification and known technology without departing from the drift and the range of the present invention, and may be included in the protection range. Further, respective constituent elements in the above-described embodiments may be optionally combined within the range that does not depart from the drifts of the present invention.

In the above-described embodiments, antenna is exemplified, but the invention can be applied to an antenna port. The antenna port indicates a logical antenna in which one or plural physical antennas are provided. That is, the antenna port is not limited to one physical antenna, and may include plural antennas. For example, in the LTE, how many physical antennas constitute the antenna port is not prescribed, but the antenna port is prescribed as the minimum unit in which a base station can transmit other reference signals. Further, the antenna port may be prescribed as the minimum unit for multiplying the weights of precoding vectors.

In the above-described embodiments, it is exemplified that the invention is configured by hardware. Alternatively it is also possible to realize the invention by software.

Further, respective function blocks used in the description of the embodiments may be typically realized by an LSI that is an integrated circuit. They may be individually fabricated into one chip or a part or the whole of them may be fabricated into one chip. Here, although LSI is exemplified, it may be called an IC, a system LSI, super LSI, ultra LSI, or the like, due to the difference in integrity.

Further, the technique for the integrated circuit is not limited to LSI, and may be realized as a dedicated circuit or a general purpose processor. After the LSI fabrication, a FPGA (Field Programmable Gate array) that can be programmed after fabrication of the LSI or a reconfigurable processor that can reconfigure the connection or setting of the circuit cells in the LSI may be used.

Further, if technique for an integrated circuit appears, which substitutes LSI with the progress of the semiconductor technology or other derived technologies, the function blocks may be integrated using the technologies. Biotechnology may be possibly adapted.

This application is based on Japanese Patent Application (Japanese Patent Application No. 2009-116622) filed on May 13, 2009, the contents of which are incorporated herein by reference in its entirety.

Industrial Applicability

According to the invention, the frequency diversity effect can be improved by preventing related bits in encoded data from being biased to a specified carrier in the case of performing a multicarrier operation. Accordingly, the invention is useful as a radio communication device and a radio communication method that can be applied to a radio communication system that performs multicarrier operation using a plurality of carriers, for example, a radio communication system such as IEEE 802.16m.

REFERENCE SIGNS LIST

100: TRANSMITTER
108: CHANNEL ENCODER
112: MODULATOR
116: DATA SEGMENTATION SECTION
120: SEGMENT MAPPING SECTION
124: SET OF SUBCARRIER MAPPING/IFFT SECTIONS
124*a*: SUBCARRIER MAPPING/IFFT SECTION
124*b*: SUBCARRIER MAPPING/IFFT SECTION
126: SET OF RF CARRIERS
126*a*: RF CARRIER
126*b*: RF CARRIER
150: RECEIVER
156: SET OF SUBCARRIER DEMAPPING/FFT SECTIONS
156*a*: SUBCARRIER DEMAPPING/FFT SECTION
156*b*: SUBCARRIER DEMAPPING/FFT SECTION
158: SEGMENT DEMAPPING SECTION
162: DATA ASSEMBLY SECTION
166: DEMODULATOR
170: CHANNEL DECODER
202: CTC ENCODER
206: BIT SEPARATOR
208: SUBBLOCK INTERLEAVING SECTION
212: BIT GROUPING SECTION
216: BIT SELECTOR
1302: SYMBOL GROUPING SECTION
1304: GROUP CYCLIC SHIFTER
1306: GROUP SUBSTITUTION AND SEGMENTATION SECTION

The invention claimed is:

1. A radio communication device for performing a multicarrier operation using a plurality of carriers, the radio communication device comprising:
   a modulator that is configured to generate a modulated symbol sequence in accordance with a predetermined modulation scheme from an encoded data sequence to be transmitted;
   a data segmentation section that is configured to segment the modulated symbol sequence; and a segment mapping section that is configured to map segmented modulated symbol blocks on the plurality of carriers, wherein the data segmentation section includes:

a symbol grouping section that is configured to group each part of a plurality of parts in the modulated symbol sequence which can be divided on the basis of subblocks in the encoded data sequence, into a same number of groups;

a group cyclic shifter that is configured to cyclically shift a plurality of groups for each part of the plurality of parts with shift amounts which differ among the plurality of parts; and a group substitution and segmentation section which is configured to substitute the cyclically-shifted groups for each part of the plurality of parts in the modulated symbol sequence with one another among the plurality of parts, to segment the groups into a plurality of blocks.

2. The radio communication device according to claim 1, wherein the symbol grouping section is configured to group each part of J×K parts in the modulated symbol sequence into N groups so that the N groups of the same part have almost the same number of modulated symbols, and the group cyclic shifter is configured to cyclically shift the N groups for each part of any (K−1) parts in the modulated symbol sequence, where J indicates a number of FEC (Forward Error Correction) blocks that correspond to the modulated symbol sequence, N indicates a number of LRUs (Logical Resource Units) allocated to the FEC blocks, and K indicates a positive integer which is equal to 3 or 4.

3. The radio communication device according to claim 2, wherein the K parts in the modulated symbol sequence are three parts, where K is equal to 3, and includes a systematic part A, a systematic part B and a parity part that are generated from bit sequences of systematic bits A, systematic bits B and parity bits in the encoded data sequence, respectively.

4. The radio communication device according to claim 2, wherein the K parts in the modulated symbol sequence are four parts, where K is equal to 4, and includes a systematic part A, a systematic part B, a parity part Y and a parity part W that are generated from bit sequences of systematic bits A, systematic bits B, parity bits $Y_1$ and $Y_2$, and parity bits $W_1$ and $W_2$ in the encoded data sequence, respectively.

5. The radio communication device according to claim 2, wherein the group cyclic shifter cyclically shifts the groups for each part of any (K−1) parts in the modulated symbol sequence with (K−1) number of different shift amounts in the same direction, respectively.

6. The radio communication device according to claim 5, wherein the (K−1) number of shift amounts are represented by i×⌊N/K⌋ groups for i=1, 2, . . . , K−1, where "⌊ ⌋" indicates a floor operator.

7. The radio communication device according to claim 2, wherein when K=3, the group cyclic shifter cyclically shifts the groups for each part of two parts of any (K−1) parts in the modulated symbol sequence with a same shift amount in opposite directions, respectively.

8. The radio communication device according to claim 7, wherein the shift amount is represented by ⌊N/K⌋ groups, where "⌊ ⌋" indicates a floor operator.

9. A radio communication device for performing a multicarrier operation using a plurality of carriers, the radio communication device comprising:

a segment demapping section that is configured to demap received modulated symbols which have been mapped on the plurality of carriers to restore segmented modulated symbol blocks;

a data assembly section that is configured to assemble an original modulated symbol sequence from the segmented modulated symbol blocks; and a demodulator that is configured to demodulate the modulated symbol sequence in accordance with a predetermined modulation scheme and generate an encoded data sequence to be received, wherein the data assembly section includes a function block that is configured to perform an inverse process corresponding to functions of the data segmentation section of the radio communication device as defined in claim 1, so as to perform a combining and an inverse substitution of the segmented modulated symbol blocks, a group cyclic shift in reverse direction, an unification of respective grouped parts, and a combining of the modulated symbol sequence.

10. A radio communication method in a radio communication device for performing a multicarrier operation using a plurality of carriers, the radio communication method comprising the steps of:

generating a modulated symbol sequence in accordance with a predetermined modulation scheme from an encoded data sequence to be transmitted;

segmenting the modulated symbol sequence; and mapping segmented modulated symbol blocks on the plurality of carriers, wherein the step of the segmentation includes the steps of:

grouping each part of a plurality of parts in the modulated symbol sequence which can be divided on the basis of subblocks in the encoded data sequence, into a same number of groups;

cyclically shifting a plurality of groups for each part of the plurality of parts with shift amounts which differ among the plurality of parts; and substituting the cyclically-shifted groups for each part of the plurality of parts in the modulated symbol sequence among the plurality of parts, to segment the groups into a plurality of blocks.

11. The radio communication method according to claim 10, wherein in the step of grouping, each part of J×K parts in the modulated symbol sequence is grouped into N groups so that the N groups of the same part have almost the same number of modulated symbols, and in the step of cyclically shifting, the N groups for each part of any (K−1) parts in the modulated symbol sequence are cyclically shifted, where J indicates a number of FEC blocks that corresponds to the modulated symbol sequence, N indicates a number of LRUs allocated to the FEC blocks, and K indicates a positive integer which is equal to 3 or 4.

12. A radio communication method in a radio communication device for performing a multicarrier operation using a plurality of carriers, the radio communication method comprising the steps of:

demapping received modulated symbols which have been mapped on the plurality of carriers to restore segmented modulated symbol blocks;

assembling an original modulated symbol sequence from the segmented modulated symbol blocks; and demodulating the modulated symbol sequence in accordance with a predetermined modulation scheme to generate an encoded data sequence to be received, wherein the step of assembling the modulated symbol sequence includes a step of performing inverse process corresponding to the step of the segmentation of the radio communication method as defined in claim 10 so as to perform a combining and an inverse substitution of the segmented modulated symbol blocks, a group cyclic shift in reverse direction, an unification of respective grouped parts, and a combining of the modulated symbol sequence.

* * * * *